(12) United States Patent
Gu

(10) Patent No.: US 7,719,383 B2
(45) Date of Patent: May 18, 2010

(54) HIGH ISOLATION ELECTRONIC MULTIPLE POLE MULTIPLE THROW SWITCH

(76) Inventor: Zeji Gu, 16 Fairland St., Lexington, MA (US) 02421

( * ) Notice: Subject to any disclaimer, the term of this patent is extended or adjusted under 35 U.S.C. 154(b) by 80 days.

(21) Appl. No.: 12/150,371

(22) Filed: Apr. 28, 2008

(65) Prior Publication Data

US 2008/0265977 A1 Oct. 30, 2008

Related U.S. Application Data

(60) Provisional application No. 60/926,971, filed on Apr. 30, 2007.

(51) Int. Cl.
*H01P 1/10* (2006.01)
*H01P 1/15* (2006.01)

(52) U.S. Cl. .................. 333/101; 333/103
(58) Field of Classification Search ............ 333/101, 333/103, 104, 105, 107, 262
See application file for complete search history.

(56) References Cited

U.S. PATENT DOCUMENTS

| | | | |
|---|---|---|---|
| 4,731,594 A | 3/1988 | Kumar | 333/103 |
| 4,983,865 A | 1/1991 | Ho et al. | 307/571 |
| 5,061,911 A * | 10/1991 | Weidman et al. | 333/104 |
| 5,446,424 A | 8/1995 | Pierro | 333/104 |
| 5,465,087 A | 11/1995 | Cooperman et al. | 340/825.8 |
| 5,642,083 A | 6/1997 | Kato et al. | 333/103 |
| 5,696,470 A * | 12/1997 | Gupta et al. | 333/103 |

(Continued)

OTHER PUBLICATIONS

Schindler, M.J., Miller, M.E., Simon, K.M. 1988 IEEE MTT-S Digest 1001-1005 DC-20 GHZ N X M passive switches.

(Continued)

*Primary Examiner*—Dean O Takaoka
(74) *Attorney, Agent, or Firm*—Joyce E. Lauer

(57) ABSTRACT

A high isolation electronic multiple pole multiple throw (MPNT) switching device is formed as a ring circuit that includes plural poles, plural throws, plural series switches and plural means for shunting. Each series switch receives a control signal, and each means for shunting receives shunt control signals. In one aspect, the shunt control signals include control signals received by distant series switches. In another aspect, the shunt control signals include control signals received by adjacent series switches. In another aspect, the shunt control signals include signals complementary to signals received by adjacent series switches. In another aspect, the shunt control signals include pole DC potentials or throw DC potentials. In another aspect, a switching device may operate in multiple transmission mode or multiple input multiple output (MIMO) mode. The MPNT switching device provides low insertion loss and high isolation at a wide range of frequencies.

21 Claims, 11 Drawing Sheets

U.S. PATENT DOCUMENTS

| | | | | |
|---|---|---|---|---|
| 5,731,607 | A | * | 3/1998 | Kohama .................... 257/275 |
| 5,812,939 | A | | 9/1998 | Kohama ...................... 455/78 |
| 5,883,541 | A | * | 3/1999 | Tahara et al. ................ 327/434 |
| 5,933,122 | A | | 8/1999 | Sauer et al. .................. 348/876 |
| 5,991,607 | A | | 11/1999 | Burdenski et al. ............. 455/83 |
| 6,265,953 | B1 | | 7/2001 | Romano .................... 333/101 |
| 6,496,082 | B1 | | 12/2002 | DiPiazza ................... 333/101 |
| 6,737,933 | B2 | | 5/2004 | Nyberg .................... 333/81 R |
| 6,774,701 | B1 | | 8/2004 | Heston et al. ............... 327/408 |
| 7,079,816 | B2 | | 7/2006 | Khorram et al. .............. 455/78 |
| 7,138,846 | B2 | | 11/2006 | Suwa et al. .................. 327/308 |
| 7,199,635 | B2 | * | 4/2007 | Nakatsuka et al. .......... 327/308 |
| 7,307,490 | B2 | | 12/2007 | Kizuki et al. ............... 333/101 |
| 7,345,521 | B2 | * | 3/2008 | Takahashi et al. ........... 327/308 |
| 2009/0153222 | A1 | * | 6/2009 | Gu .............................. 327/365 |

OTHER PUBLICATIONS

Schindler, M.J., Miller, M.E., Simon, K.M. 1988 IEEE Transactions on Microwave Theory and Techniques 36:1604-1613 DC-20 GHZ N X M passive switches.

Schindler, M.J., Simon, K.M. 1989 IEEE GaAs IC Symposium 181-183 A 2-18 GHz non-blocking active 2 × 2 switch.

Kohama, K., Ohgihara, T., Murakami, Y. 1995 IEEE GaAs IC Symposium 75-78 High power DPDT antenna switch MMIC for digital cellular systems.

Kohama, K., Ohgihara, T., Murakami, Y. 1996 IEEE Journal of Solid-State Circuits 31:1406-1411 High power DPDT antenna switch MMIC for digital cellular systems.

Nagayama, A., Nishibe, M., Mineshima, N. 1999 IEEE Journal of Solid-State Circuits 34:1051-1055 Low insertion loss DP3T MMIC switch for dual-ban cellular phones.

Gu, Z., Johnson, D., Belletete, S., Fryklund, D. 2003 IEEE Radio Frequency Integrated Circuits Symposium 687-690 A high power DPDT MMIC switch for broadband wireless applications.

Lee, C.H., Banerjee, B., Laskar, J. 2004 IEEE Radio Frequency Integrated Circuits Symposium 571-574 A novel DP4T antenna switch for dual-band WLAN applications.

Lee, C.H., Banerjee, B., Laskar, J. 2004 IEEE MTT-S Digest 1137-1140 Novel T/R switch architectures for MIMO applications.

Yang, Z., Yang, T., You, Y., Xu, R. 2005 IEEE Asia-Pacific Microwave Conference Proceedings A 2 GHz high isolation DPDT switch MMIC.

New Japan Radio internet product catalogue dated May 16, 2005 pp. 1 and 27 DP4T switch NJG16xx.

Hexawave internet product data sheet dated Sep. 2005 pp. 1-4 HWS379 GaAs DC—6 GHz DP4T switch.

Sony internet product data sheet (undated) downloaded Jan. 2008 pp. 1-5 CXG1216UR High Power DP4T Switch with Logic Control.

NEC internet product data sheet dated Oct. 2007 pp. 1-10 PG2181T5R High Power DP4T Switch for WiMAX.

\* cited by examiner

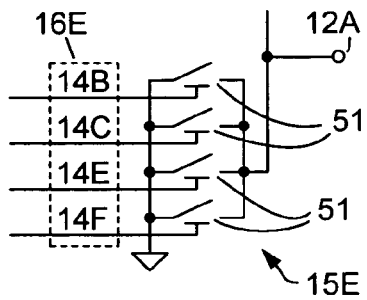
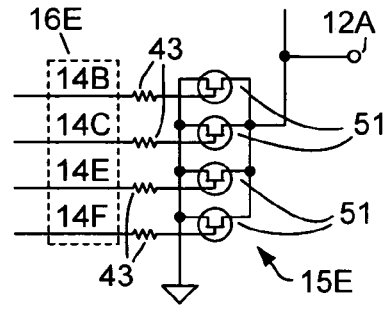
FIG. 3A            FIG. 3B
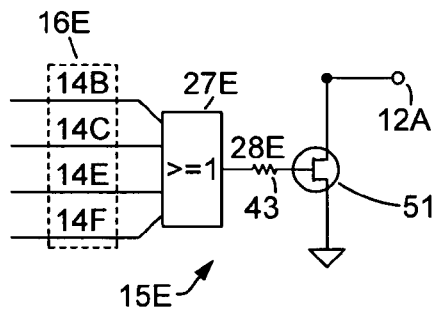
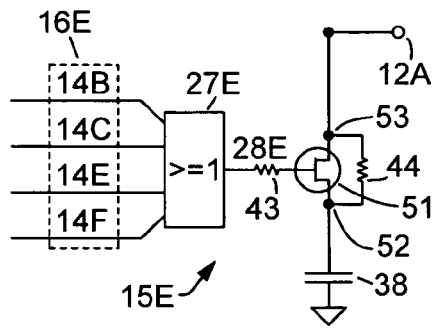
FIG. 3C            FIG. 3D
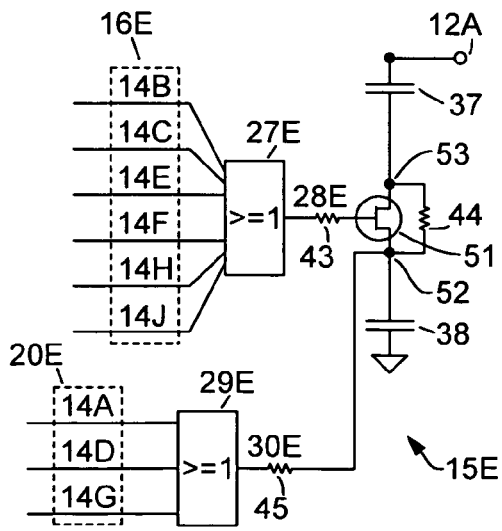
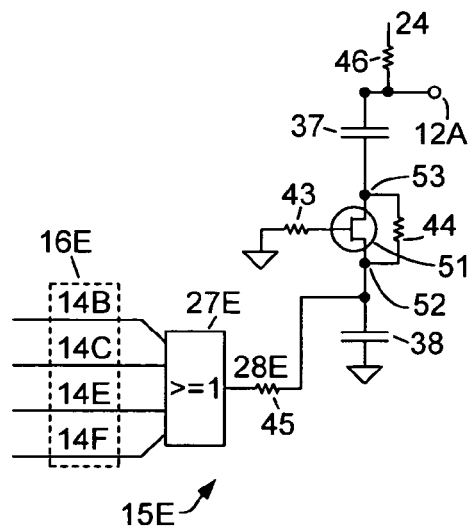
FIG. 3E            FIG. 3F

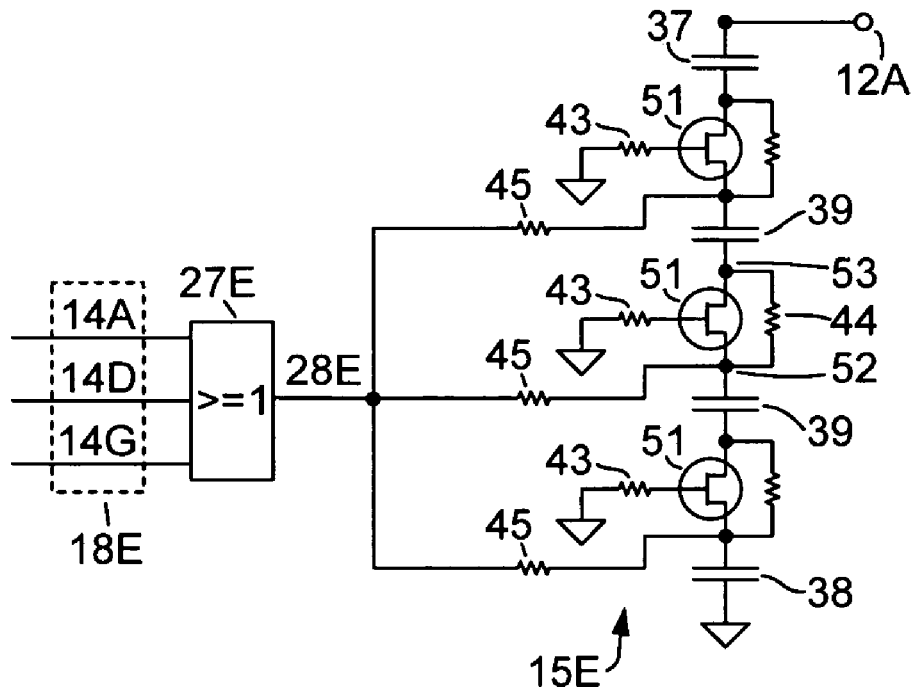
FIG. 8G
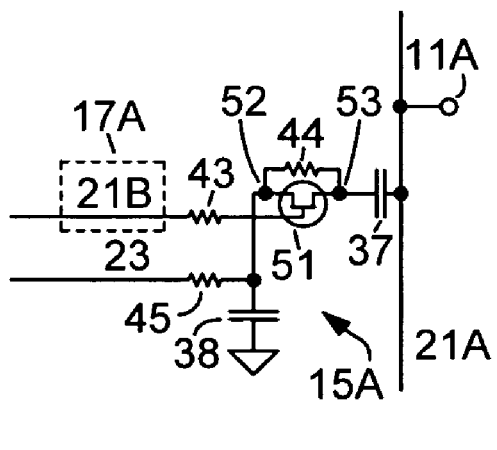
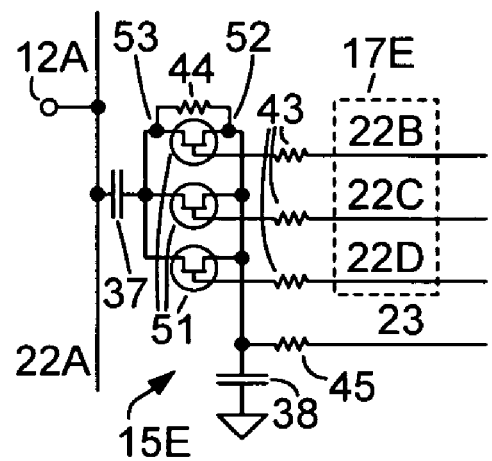
FIG. 9A   FIG. 9B

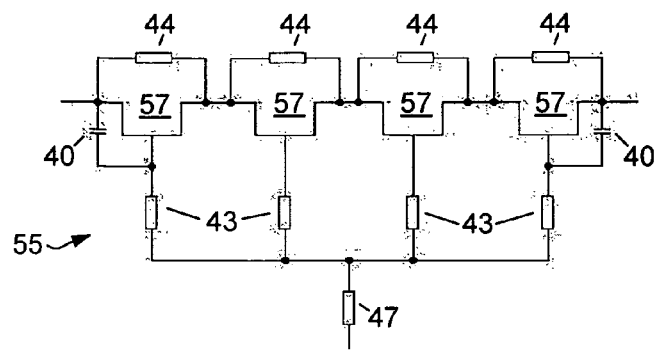
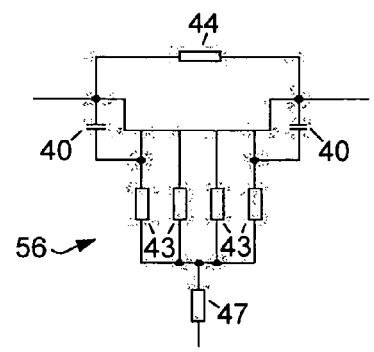
FIG. 11A    FIG. 11B
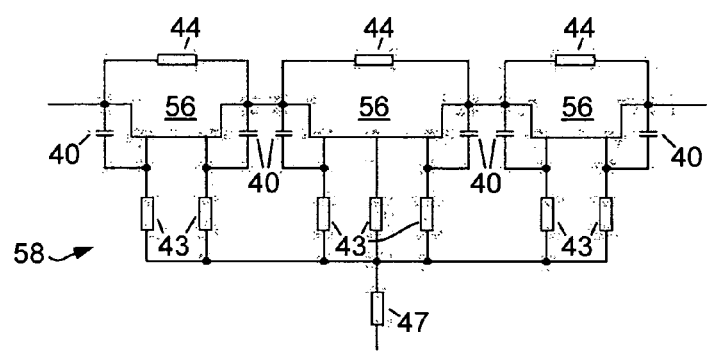
FIG. 11C
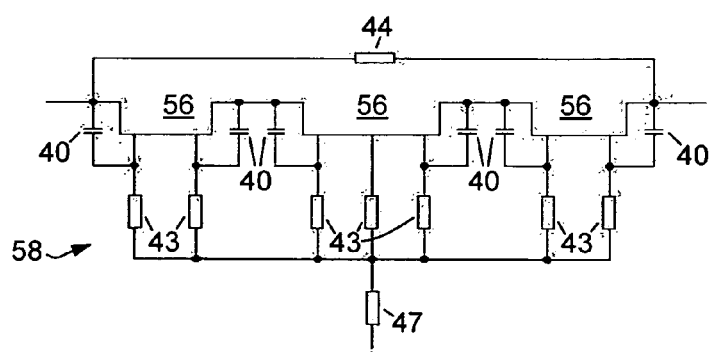
FIG. 11D

US 7,719,383 B2

HIGH ISOLATION ELECTRONIC MULTIPLE POLE MULTIPLE THROW SWITCH

BACKGROUND

The present application claims the benefit under 35 U.S.C. §119 of Provisional Application Ser. No. 60/926,971 which was filed on Apr. 30, 2007. The above-referenced application is incorporated by reference herein.

Electronic multiple pole multiple throw (MPNT) switches are widely used. An MPNT switch is a switch having M poles (P) and N throws (T), where M>1 and N>1. A pole and a throw are coupled to one another by a path that includes at least one switching element. An electrical signal is routed on a path between one of the M poles and one of the N throws when that path is in a conducting state. In a single transmission mode MPNT switch, only a single pole-throw path is conducting at one time. In a multiple transmission mode switch, more than one pole-throw path may be conducting at the same time.

A switch having multiple inputs and multiple outputs is an example of an MPNT switch. An antenna switch for a wireless communication device is one application for an MPNT switch. In one example of a 2P2T (DPDT) antenna switch, a first pole is coupled to a receiver, a second pole is coupled to a transmitter, a first throw is coupled to a first antenna, and a second throw is coupled to a second antenna. Depending upon the state of the switching elements within the paths, the transmitter may be operably coupled to one of the antennas, or the receiver may be operably coupled to one of the antennas. MPNT switches having greater numbers of poles or throws, such as 2P4T (DP4T) or 3P3T switches, may be used in more complex devices such as communication devices that include additional antennas or multiple receivers or transmitters. A multiple transmission mode MPNT switch may be used in a communication device that operates in multiple input multiple output (MIMO) mode. In MIMO mode, two or more paths are conducting at the same time, thereby enabling two or more antennas to transmit or receive signals at the same time.

SUMMARY

A high isolation electronic multiple pole multiple throw (MPNT) switching device is formed as a ring circuit that includes plural poles, plural throws, plural series switches and plural means for shunting. Each series switch receives a control signal, and each means for shunting receives shunt control signals. In one aspect, the shunt control signals include control signals received by distant series switches. In another aspect, the shunt control signals include control signals received by adjacent series switches. In another aspect, the shunt control signals include signals complementary to signals received by adjacent series switches. In another aspect, the shunt control signals include pole DC potentials or throw DC potentials. In another aspect, a switching device may operate in multiple transmission mode or multiple input multiple output (MIMO) mode. The MPNT switching device provides low insertion loss and high isolation at a wide range of frequencies.

Additional embodiments are described in the detailed description below. This summary does not purport to define the invention. The invention is defined by the claims.

BRIEF DESCRIPTION OF THE DRAWINGS

FIG. 3A is a simplified schematic circuit diagram of throw 12A and coupled means for shunting 15E, in accordance with the embodiment of FIG. 1.

FIG. 3B is a simplified schematic circuit diagram of throw 12A and coupled means for shunting 15E, in accordance with an embodiment.

FIG. 3C is a simplified schematic circuit diagram of throw 12A and coupled means for shunting 15E, in accordance with an embodiment.

FIG. 3D is a simplified schematic circuit diagram of throw 12A and coupled means for shunting 15E, in accordance with an embodiment.

FIG. 3E is a simplified schematic circuit diagram of throw 12A and coupled means for shunting 15E, in accordance with the embodiment of FIG. 6.

FIG. 3F is a simplified schematic circuit diagram of throw 12A and coupled means for shunting 15E, in accordance with an embodiment.

FIG. 8G is a simplified schematic circuit diagram of throw 12A and coupled means for shunting 15E, in accordance with an embodiment.

FIG. 9A is a simplified schematic circuit diagram of pole 11A and coupled means for shunting 15A, in accordance with the embodiment of FIG. 10.

FIG. 9B is a simplified schematic circuit diagram of throw 12A and coupled means for shunting 15E, in accordance with the embodiment of FIG. 10.

FIG. 11A depicts a switching element that includes four single-gate FETs in series.

FIG. 11B depicts a multi-gate FET.

FIG. 11C depicts a switching element 58 that includes three multi-gate FETs.

FIG. 11D depicts a switching element 58 that includes three multi-gate FETs.

DETAILED DESCRIPTION

Reference will now be made in detail to some embodiments, examples of which are illustrated in the accompanying drawings.

Figure 1:
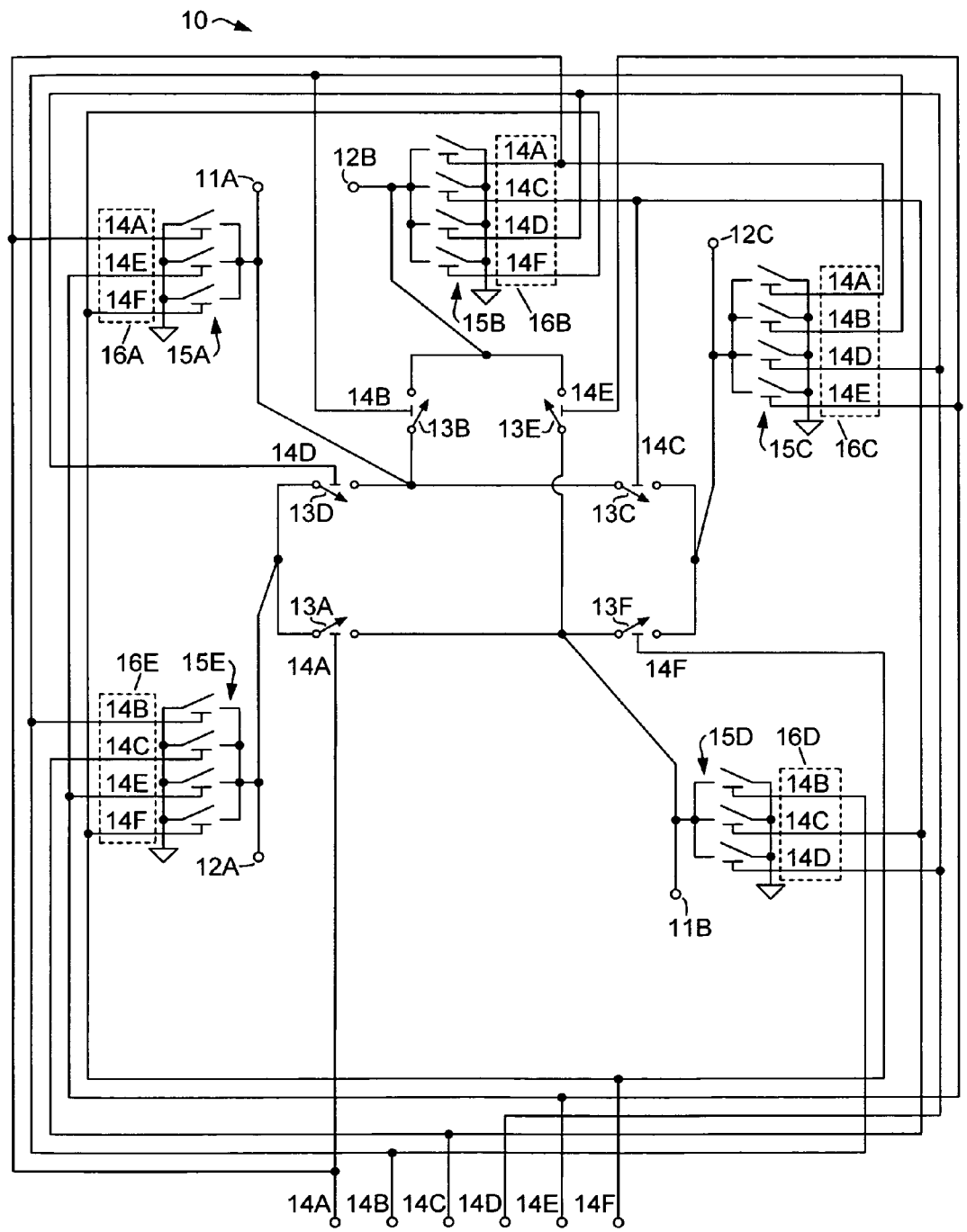
FIG. 1 is a simplified schematic circuit diagram of a 2P3T switching device having a ring topology, in accordance with an embodiment.

FIG. 1 is a simplified schematic circuit diagram of a 2P3T switching device 10 having a ring topology, in accordance with an embodiment. Switching device 10 comprises five terminals, the five terminals including two poles 11A and 11B and three throws 12A, 12B and 12C. In this description and in the appended claims, the term "terminal" means a pole 11 or a throw 12. Switching device 10 also comprises six series switches 13A-F, each series switch 13 receiving a control signal 14. For example, series switch 13A receives control signal 14A, and series switch 13B receives control signal 14B. Similarly, series switches 13C-F receive control signals 14C-F, respectively. Each series switch 13 is coupled between one of the poles 11 and one of the throws 12. For example, series switch 13E is coupled between pole 11B and throw 12B. Each pole 11 is operably coupled to each throw 12 through one of the series switches 13. For example, pole 11B is operably coupled to throw 12C through series switch 13F.

Switching device 10 also comprises five means for shunting 15A-E. In this description and in the appended claims, the term "means for shunting" 15 means a structure that comprises at least one switching element 51 that is coupled between ground and a node or other component, whereby grounding of the node or other component may be varied using the switching element. Many embodiments of means for shunting 15 comprising switching element 51 are depicted herein in subsequent Figures. In the embodiment of FIG. 1, for each terminal, one of the means for shunting 15 is coupled between plural adjacent series switches 13 for the terminal. For example, means for shunting 15D is coupled between series switches 13A, 13E and 13F. Series switches 13A, 13E and 13F are adjacent series switches 13 for pole 11B. In this description and in the appended claims, the term "coupled means for shunting" refers to the one of the means for shunting 15 that is coupled between the adjacent series switches 13 for an individual terminal. Means for shunting 15D is the coupled means for shunting for pole 11B.

In this description and in the appended claims, the term "adjacent series switch" has the following meaning. For each terminal, each adjacent series switch for the terminal is one of the series switches 13, and no other one of the series switches 13 is coupled between the terminal and each adjacent series 13 switch for the terminal. For example, series switches 13A, 13E and 13F are adjacent series switches 13 for pole 11B, and no other series switch 13 is coupled between pole 11B and series switch 13A or series switch 13E or series switch 13F.

For each terminal there are also plural distant series switches 13. In this description and in the appended claims, the term "distant series switch" has the following meaning. For each terminal, each distant series switch 13 for the terminal is one of the series switches 13, each distant series switch 13 for the terminal is coupled to the terminal through one of the adjacent series switches 13 for the terminal, and each adjacent series switch 13 for the terminal is coupled between the terminal and at least one of the distant series switches 13 for the terminal. For example, series switches 13D, 13B and 13C are distant series switches for pole 11B. Recall that series switches 13A, 13E and 13F are adjacent series switches 13 for pole 11B. Distant series switches 13D, 13B and 13C are coupled to pole 11B through adjacent series switches 13A, 13E and 13F, respectively.

In the embodiment of FIG. 1, each means for shunting 15 receives plural shunt control signals 16. In the embodiment of FIG. 1, for each terminal the shunt control signals 16 for the coupled means for shunting 15 include the control signal 14 received by each distant series switch 13 for the terminal. For example, for throw 12B (one of the five terminals), shunt control signals 16B for coupled means for shunting 15B include control signals 14D, 14A, 14C and 14F that are also received by series switches 13D, 13A, 13C and 13F, respectively, which are the distant series switches 13 for throw 12B. Table 1 identifies the shunt control signals 16 for each means for shunting (MFS) 15 for the 2P3T switching device 10 of FIG. 1. In other embodiments, the shunt control signals for the coupled means for shunting 15 may include different signals, as described below in connection with FIG. 2 and FIGS. 6-10.

TABLE 1

| MFS | Shunt Control Signals |
|-----|----------------------|
| 15A | 14A, 14E, 14F |
| 15B | 14D, 14A, 14C, 14F |
| 15C | 14D, 14A, 14B, 14E |
| 15D | 14D, 14B, 14C |
| 15E | 14B, 14E, 14C, 14F |

Figure 2A:
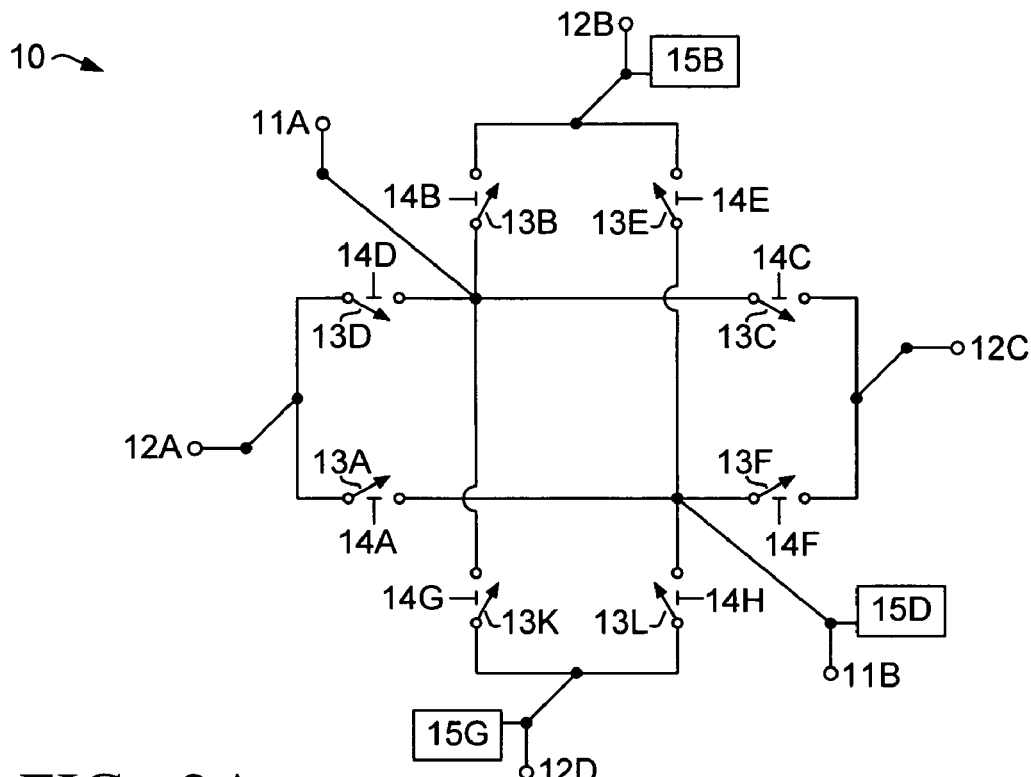
FIG. 2A is a simplified schematic circuit diagram of a 2P4T switching device having a ring topology, in which some but not all of the terminals (poles and throws) have a coupled means for shunting.

In this description and in the appended claims, the "pole count M" means the number of poles 11, the "throw count N" means the number of throws 12, the "series switch count" means the number of series switches 13, and the "shunt count" means the number of means for shunting 15. For any embodiment, the series switch count equals the pole count M multiplied by the throw count N. In the embodiment of FIG. 1, the pole count M is two, the throw count N is three, and the series switch count is six. In some embodiments, such as that of FIG. 1, the shunt count equals the pole count M plus the throw count N, so that each terminal (pole 11 or throw 12) has a coupled means for shunting 15. In other embodiments, the shunt count may be less than the sum of the pole count M and the throw count N, so that some but not all of the terminals have a coupled means for shunting 15. FIG. 2A is a simplified schematic circuit diagram of a 2P4T (DP4T) switching device 10 having a ring topology, in which some but not all of the terminals (poles 11 and throws 12) have a coupled means for shunting 15. FIG. 2A is described following the description of FIG. 5.

FIG. 3A is a simplified schematic circuit diagram of throw 12A and coupled means for shunting 15E, in accordance with the embodiment of FIG. 1. In the embodiment of FIGS. 1 and 3A, each means for shunting 15 comprises plural switching elements 51, and each switching element 51 receives a separate one of the shunt control signals 16 for the means for shunting 15. For example, control signals 14B, 14C, 14E and 14F are the shunt control signals 16E for means for shunting 15E that is depicted in FIG. 3A. Each switching element 51 within means for shunting 15E receives a separate one of the control signals 14B, 14C, 14E and 14F. In the embodiment of FIGS. 1 and 3A, switching elements 51 for each means for shunting 15 are coupled in a parallel configuration between a terminal and ground. While FIG. 3A depicts additional details such as reference numeral 51 for means for shunting 15E, it is understood that these additional details apply also to each of the other means for shunting 15A-D.

The switching device 10 of FIG. 1 may be used in single transmission mode, such that only a single pole-throw path is conducting at one time. Control signals 14 are DC signals that control switching elements within series switches 13 and within means for shunting 15. For operation of switching device 10 in single transmission mode, one of the control signals 14 has a first value when each of the other control signals 14 has a second value.

For example, if switching device 10 employed switching elements that turn on in response to high voltage (positive logic), one control signal 14 could have a high voltage when each of the other control signals 14 has a low voltage. For example, control signal 14C could have a high voltage when control signals 14A,B,D,E,F have a low voltage. Alternatively, if switching device 10 employed switching elements that turn on in response to low voltage (negative logic), one control signal 14 could have a low voltage when each of the other control signals 14 has a high voltage.

Using positive logic switching elements with control signal 14C at high voltage and all other control signals 14 at low voltage, series switch 13C will be turned on and all other series switches 13 will be turned off. Series switch 13C is coupled between pole 11A and throw 12C. Means for shunting 15A and 15C are also coupled between pole 11A and throw 12C. Means for shunting 15A will not shunt to ground, because shunt control signals 16A, which include control signals 14A, E and F, are all at low voltage so that each switching element 51 within means for shunting 15A is turned off. Similarly, means for shunting 15C will not shunt to ground, because shunt control signals 16C, which include control signals 14A, B, D and E, are all at low voltage so that each switching element 51 within means for shunting 15C is turned off.

Thus, series switch 13C is turned on and means for shunting 15A and 15C are turned off (do not shunt to ground), resulting in a conducting path between pole 11A and throw 12C. Each of the other five pole-throw paths is not conducting, because series switches 13A,B,D,E,F are turned off and means for shunting 15B, D, E and F are turned on (shunt to ground). The insertion loss is relatively low for the conducting path between pole 11A and throw 12C, because means for shunting 15A and 15C are turned off. Isolation is relatively high between the various terminals because series switches 13A,B,D,E,F are turned off and means for shunting 15B, D, E and F are turned on.

Embodiments described herein may be implemented as integrated circuits or using discrete components. Switching elements within switching device 10 may be implemented as semiconductor switching elements such as diodes or pin diodes or bipolar transistors or field effect transistors (FET). For example, switching elements may be implemented as silicon based (Si-based) FETs or as gallium arsenide based (GaAs-based) FETs. Si-based FETs include silicon junction FET (JFET), silicon metal-semiconductor FET (MESFET), silicon germanium bipolar CMOS (SiGe BiCMOS), and various types of silicon metal-oxide-semiconductor FET (MOSFET) such as NMOS, CMOS, silicon on sapphire (SOS), and silicon on insulator (SOI). GaAs-based FETs include GaAs JFET, GaAs MESFET, GaAs pseudomorphic high electron mobility transistor (pHEMT), GaAs metamorphic high electron mobility transistor (mHEMT), and GaAs heterostructure FET (HFET). NMOS and CMOS FETs typically have a pinch-off voltage of positive 0.7 volts, and work at positive control voltages (positive logic). GaAs pHEMTs typically have a pinch-off voltage of negative 0.5 to negative 1.0 volts, and work at either positive or negative control voltages. GaAs MESFETs typically have a pinch-off voltage of negative 0.5 to negative 1.0 volts, and work at negative control voltages. GaAs mHEMTs typically have a pinch-off voltage of negative 0.75 volts, and work at either positive or negative control voltages.

In this description and in the appended claims, the term series switch 13 means one or more switching element that is coupled in series between a pole 11 and a throw 12 and that receives a control signal 14. Where a series switch 13 includes more than one switching element, all of the switching elements for that series switch 13 are controlled by the same control signal 14. To simplify the figures, each series switch 13 is depicted as a single switching element receiving a single control signal 14. It is understood, however, that in some embodiments a series switch 13 may be implemented using plural switching elements controlled by a single control signal 14. Furthermore, the individual series switches 13 within a switching device 10 may be implemented using different types of switching elements. Similarly, a means for shunting 15 may include one or more switching elements 51. To simplify the figures, each switching element 51 is depicted as a single switching element. It is understood, however, that in some embodiments a switching element 51 may be implemented using plural switching elements. In some embodiments, two separate variable signals (e.g. output signals 28 and 30 in FIG. 3E) may be received at a single switching element 51. Furthermore, the individual switching elements 51 within a switching device 10 may be implemented using different types of switching elements. Several examples of FET switching elements are described in connection with FIGS. 11A-E. For an FET switching element, a resistor is typically used to provide DC bias to the FET gate and also to serve as an RF block to prevent signal current leakage from the FET source or drain to the gate. For example, the gate of an FET switching element in a series switch 13 typically is coupled to a resistor.

FIGS. 3B-3F depict means for shunting 15E for several alternative embodiments of switching device 10. Each alternative embodiment includes the same overall structure as in the embodiment of FIG. 1, including poles 11, throws 12, series switches 13 and means for shunting 15. In particular, for each alternative embodiment, each means for shunting 15 receives the same shunt control signals 16 as for the embodiment of FIG. 1. The alternative embodiments differ from the embodiment of FIG. 1 and FIG. 3A with respect to circuitry within the means for shunting 15. While FIGS. 3B-3F depict circuitry for means for shunting 15E, it is understood that the depicted circuitry applies also to each of the other means for shunting 15A-D.

For any of the switching devices 10 described herein, the means for shunting 15 may be the same within the switching device 10 or the means for shunting 15 may differ. In the embodiments depicted in FIGS. 1, 6, 7, and 10, the means for shunting 15 are the same, so that each means for shunting 15 within a switching device 10 corresponds to the same embodiment. For example, each means for shunting 15 depicted in FIG. 1 corresponds to the embodiment of FIG.

3A. In other embodiments, it may be advantageous to employ more than one type of circuitry within means for shunting 15 so that the means for shunting 15 differ within a switching device 10. For example, at least one of the means for shunting 15 could correspond to the embodiment of FIG. 3A and at least one of the means for shunting 15 could correspond to the embodiment of FIG. 3C. In another example, at least one of the means for shunting 15 could correspond to the embodiment of FIG. 8A, at least one of the means for shunting 15 could correspond to the embodiment of FIG. 8D, and at least one of the means for shunting 15 could correspond to the embodiment of FIG. 8E or 8F or 8G. In another example, several means for shunting 15 could correspond to a first embodiment and several other means for shunting 15 could correspond to a second embodiment.

FIG. 3B is a simplified schematic circuit diagram of throw 12A and coupled means for shunting 15E, in accordance with an embodiment. The embodiment of FIG. 3B is very similar to that of FIG. 3A. In the embodiment of FIG. 3B, each of the plural switching elements 51 is an FET. Each FET receives a separate one of control signals 14B, 14C, 14E and 14F (collectively, the shunt control signals 16E) through a resistor 43. CMOS FETs or GaAs MESFETs, or GaAs pHEMTs working at negative control voltages (negative logic), are suitable for implementing switching elements 51 in the embodiment of FIG. 3B. For example, switching elements 51 may be implementing using a GaAs pHEMT, with pinch-off voltage of negative 0.5 to negative 1.0 volts, working at negative control voltages with high voltage of 0 volts and low voltage of negative 5 volts.

FIG. 3C is a simplified schematic circuit diagram of throw 12A and coupled means for shunting 15E, in accordance with an embodiment. In the embodiment of FIG. 3C, each means for shunting 15 comprises an OR gate 27 and an FET switching element 51 and a resistor 43 that is coupled between OR gate 27 and FET switching element 51. OR gate 27 receives shunt control signals 16 for means for shunting 15 and generates an output signal 28. FET switching element 51 receives output signal 28 through resistor 43 and is turned on or off according to the value of output signal 28. For example, control signals 14B, 14C, 14E and 14F are the shunt control signals 16E for means for shunting 15E that is depicted in FIG. 3C. If positive logic is used, and if control signal 14C has high voltage, then output signal 28E has high voltage and switching element 51 is turned on, so that means for shunting 15E shunts to ground. CMOS FETs or GaAs MESFETs, or GaAs pHEMTs working at negative control voltages (negative logic), are suitable for implementing switching elements 51 in the embodiment of FIG. 3C.

Use of a logic gate, such as OR gate 27 in the embodiment of FIG. 3C, allows reduction in the size of a switching device 10. If each individual control signal 14 served as an input to an individual means for shunting 15, this would require numerous means for shunting 15, resulting in increased size of the switching device 10. Furthermore, use of a single means for shunting 15 that includes a logic gate avoids the EM coupling and parasitic impacts that would occur if many separate means for shunting 15 were used. An integrated circuit switching device 10 for radio frequency (RF) signals typically comprises two dies in one package: an RF switching circuit die, and a bias circuit (also called a driver or decoder circuit) die that includes many logic gates. In one typical implementation, the RF switching circuit die is implemented using a GaAs pHEMT process, and the bias or driver circuit die is implemented using a CMOS process, which is a mature and low-cost technology. In other implementations, a GaAs pHEMT process may be used to implement both dies.

FIG. 3D is a simplified schematic circuit diagram of throw 12A and coupled means for shunting 15E, in accordance with an embodiment. The embodiment of FIG. 3D comprises all of the elements in the embodiment of FIG. 3C, and also comprises two additional elements: a resistor 44 coupled between the source 52 and the drain 53 of the FET switching element 51, and a capacitor 38 coupled between the source 52 of the FET switching element 51 and ground. Resistor 44 balances the DC potential between source 52 and drain 53. A GaAs pHEMT is suitable for implementing the FET switching element 51. In such an implementation, the switching element for each series switch 13 may be an FET switching element with a resistor coupled between the source and the drain of the FET for the series switch 13, such as the examples depicted in FIG. 11A-E of an FET switching element with at least one source-drain resistor 44. A CMOS FET is also suitable for implementing the FET switching element 51 but in this implementation capacitor 38 is omitted.

The embodiment of FIG. 3D operates as described here for means for shunting 15E. OR gate 27E receives shunt control signals 16E and generates an output signal 28E, and FET switching element 51 receives output signal 28E through resistor 43. If output signal 28E is high, because control signal 14B,C, E or F is high, then for a GaAs pHEMT switching element 51 the gate voltage Vgate is high (for example, 3 volts) and the source and drain voltages Vsource and Vdrain are high but slightly lower than Vgate (eg 0.3-0.4 volts lower). Vgate minus Vsource then equals 0.3-0.4 volts, which is greater than the typical GaAs pHEMT pinch-off voltage of negative 0.5 to negative 1.0 volts, so switching element 51 is turned on. Means for shunting 15E shunts to ground.

Alternatively, if control signal 14A or 14D is high and shunt control signals 14B,C,E,F are all low, output signal 28E will be low. Means for shunting 15E is coupled to series switches 13D and 13A, which receive control signals 14D and 14A. If control signal 14D or 14A is high so that series switch 13D or 13A is turned on, then the DC voltage at throw 12A will be relatively high, Vdrain will be relatively high, and Vsource will also be relatively high because of resistor 44. Output signal 28E is low, so Vgate is low for FET switching element 51. Vgate is low and Vsource is high, so Vgate minus Vsource has a large negative value which is less than the GaAs pHEMT typical pinch-off voltage of −0.5 to −1.0 volts, and switching element 51 is turned off. Means for shunting 15E does not shunt to ground when adjacent series switch 13D or 13A is turned on.

In the embodiment of FIG. 3D, output signal 28 from OR gate 27 is applied to the gate of FET switching element 51 which works with positive logic. In an alternative embodiment, output signal 28 from OR gate 27 may be applied to the source or drain of FET switching element 51 which then works with negative logic. FIG. 3F depicts an embodiment that is similar to the embodiment of FIG. 3D, except that output signal 28 from OR gate 27 is received through resistor 45 at the source of FET switching element 51, and the gate of FET switching element 51 is coupled to ground. In addition, in the embodiment of FIG. 3F, a fixed high voltage 24 is applied to throw 12A through a resistor 46. Voltage 24 is a fixed or supply voltage which is always high. In the embodiment of FIG. 3F, as in the embodiment of FIG. 3D, the switching element for each series switch 13 preferably is an FET switching element with a resistor coupled between the source and the drain of the FET for the series switch 13, such as the examples depicted in FIG. 11A-E of an FET switching element having at least one source-drain resistor 44. Resistor 44 balances the DC potential between the source and the drain of the FET switching element. The fixed high voltage 24, together with resistor 44 within series switches 13, ensures a high DC potential at each pole 11 and throw 12, and this high DC potential can improve power handling and linearity of the switching device 10. In another embodiment, fixed high voltage 24 and resistor 46 may be omitted. The embodiment of FIG. 3F may be implemented using GaAs pHEMTs.

The fixed high voltage 24 can also be applied to any pole 11 or throw 12 in the embodiments of FIGS. 3E, 8D, 8E, and 8G as long as source-drain resistor 44 is included within each series switch 13. In other words, for at least one of the terminals a fixed high voltage 24 may be applied at the terminal. For most types of FETs, the fixed high voltage 24 may be set to the same value as the high control voltage. For example, if the control voltages are 0 volts and 3 volts, the fixed high voltage 24 is 3 volts. For CMOS FETs using positive logic, however, the fixed high voltage 24 has a lower value than the high control voltage. For example, if the CMOS control voltages are 0 volts and 5 volts, the fixed high voltage 24 may be set to 3 volts.

FIG. 3E is a simplified schematic circuit diagram of throw 12A and coupled means for shunting 15E, in accordance with an embodiment. The embodiment of FIG. 3E is described below in connection with FIG. 6.

Figure 4:
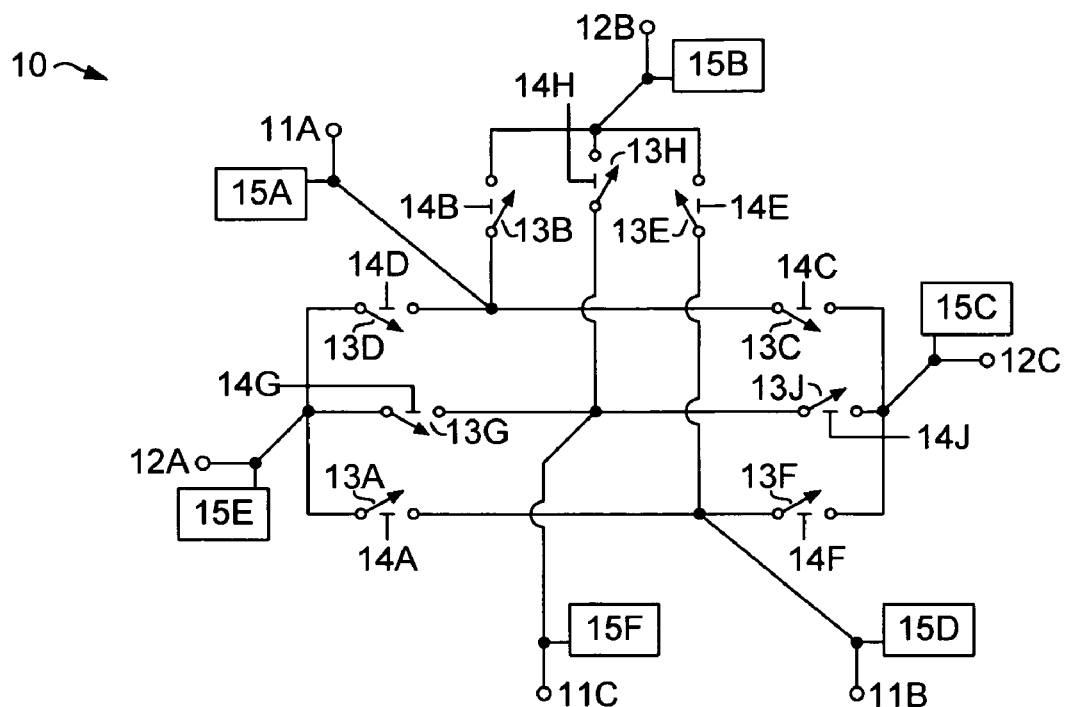
FIG. 4 is a simplified schematic circuit diagram of a 3P3T switching device having a ring topology.
Figure 5:
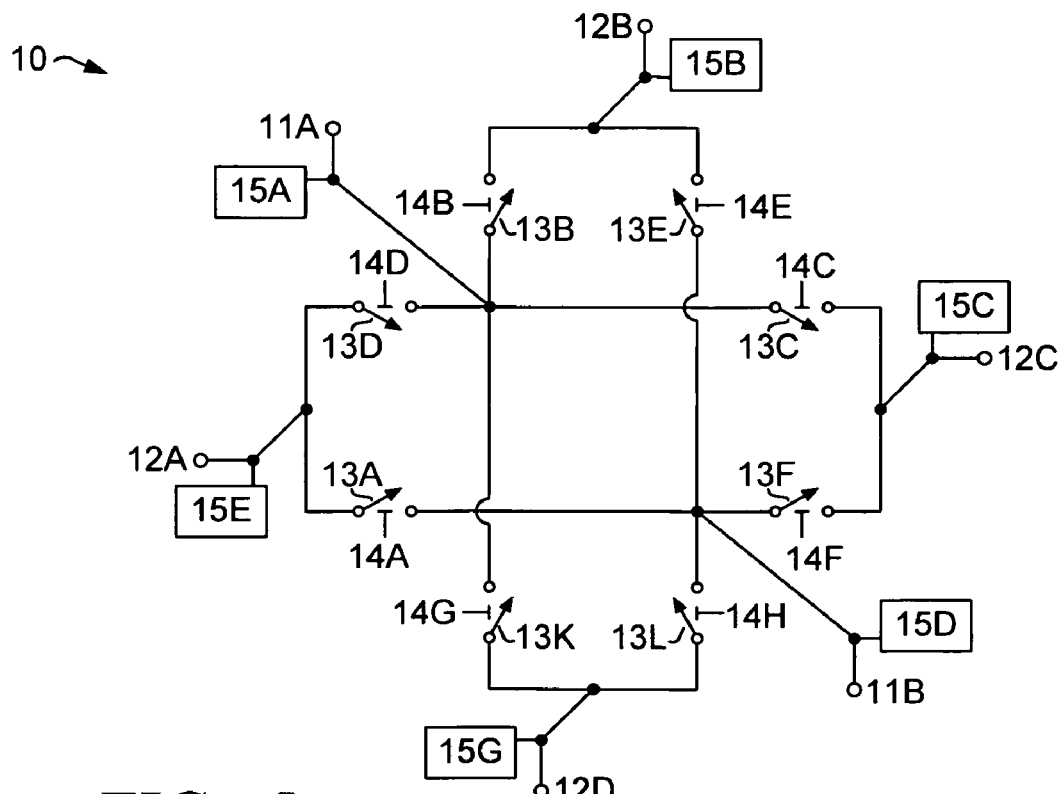
FIG. 5 is a simplified schematic circuit diagram of a 2P4T switching device having a ring topology.

FIGS. 4 and 5 depict circuit diagrams for other types of MPNT switching device 10 that include greater numbers of elements compared to the 2P3T embodiment of FIG. 1. The 2P3T switching device 10 of FIG. 1 includes plural poles 11, throws 12, series switches 13 and means for shunting 15 that are coupled in a ring topology. This 2P3T switching device 10 may be extended to form other types of MPNT switching device 10 such as, for example, a 3P3T or 2P4T (DP4T) or 3P4T switching device 10. The switching devices 10 depicted within FIGS. 4 and 5 each include all of the poles 11, throws 12, series switches 13, control signals 14, and means for shunting 15 for the 2P3T switching device 10 of FIG. 2, plus additional elements.

In FIGS. 4 and 5, each means for shunting 15 is represented as a simple rectangle, because the specific circuitry of means for shunting 15 varies according to the embodiment. Specific shunt control signals are not indicated for the means for shunting 15 in the switching devices 10 depicted within FIGS. 4 and 5, because shunt control signals may differ in various embodiments. Thus, the switching devices 10 depicted within FIGS. 4 and 5 represent general switching devices 10 that may be used with specific shunt control signals in specific embodiments. In the embodiment of FIG. 1, for example, for each terminal the shunt control signals 16 for the coupled means for shunting 15 include control signals 14 received by each distant series switch 13 for the terminal. In other embodiments, the shunt control signals for the coupled means for shunting 15 may include different types of shunt control signals.

Four types of shunt control signals are described herein. For an individual means for shunting 15, the shunt control signals are of a single type. Within a switching device 10, the shunt control signals may be of a single type or of different types for the separate means for shunting 15. In some embodiments, the shunt control signals may be of a single type for each coupled means for shunting 15; in other words, the same type of shunt control signals may be used for all of the separate means for shunting 15 within a switching device 10. In other embodiments, the shunt control signals may be of different types for the separate means for shunting 15; in other words, more than one type of shunt control signal may be used within a switching device 10. The first type of shunt control signal is the type used in the embodiment of FIG. 1, where the shunt control signals 16 for the coupled means for shunting 15 include control signals 14 received by each distant series switch 13 for the terminal. The second type is the type used in the embodiment of FIG. 7, where the shunt control signals 18 for the coupled means for shunting 15 include control signals 14 received by each adjacent series switch 13 for the terminal. The third type is the type used in the embodiments of FIGS. 8B and 8C, where the shunt control signals 18 for the coupled means for shunting 15 include a signal complementary to the control signal 14 received by each adjacent series switch 13 for the terminal. The fourth type is the type used in the embodiments of FIGS. 10 and 9A-9B, where the shunt control signals include the DC potential for each distant pole or distant throw.

FIG. 4 is a simplified schematic circuit diagram of a general 3P3T switching device 10 having a ring topology. The 3P3T switching device 10 depicted within FIG. 4 includes all of the poles 11, throws 12, series switches 13, control signals 14, and means for shunting 15 for the 2P3T switching device 10 of FIG. 1, plus additional elements. The additional elements are a pole 11C, a means for shunting 15F, and three series switches 13G, 13H and 13J that receive control signals 14G, 14H and 14J, respectively. In the embodiment of FIG. 4, the pole count M is three, the throw count N is three, the series switch count is nine, and the shunt count is six.

FIG. 5 is a simplified schematic circuit diagram of a general 2P4T (DP4T) switching device 10 having a ring topology. The 2P4T switching device 10 depicted within FIG. 5 includes all of the poles 11, throws 12, series switches 13, control signals 14, and means for shunting 15 for the 2P3T switching device 10 of FIG. 1, plus additional elements. The additional elements are a throw 12D, a means for shunting 15G, and two series switches 13K and 13L that receive control signals 14G and 14H, respectively. In the embodiment of FIG. 5, the pole count M is two, the throw count N is four, the series switch count is eight, and the shunt count is six.

As noted above, in some embodiments the shunt control signals may be of different types for the separate means for shunting 15 within a switching device 10. For an individual means for shunting 15, the shunt control signals are of a single type. In some embodiments, the shunt control signals for the coupled means for shunting 15 may be of the second type or the third type. As noted above, the second type is where the shunt control signals 18 for the coupled means for shunting 15 include control signals 14 received by each adjacent series switch 13 for the terminal, and the third type is where the shunt control signals 18 for the coupled means for shunting 15 include a signal complementary to the control signal 14 received by each adjacent series switch 13 for the terminal. Table 2 identifies the shunt control signals 18 for each means for shunting (MFS) 15 for a 2P4T switching device 10 that uses signals of the second type or the third type. The means for shunting 15 and control signals 14 listed in Table 2 are the same as those depicted in FIG. 5. The notation 14_bar indicates a signal complementary to the control signal 14 received by an adjacent series switch 13. For an individual means for shunting 15 in the embodiment of Table 2, the shunt control signals are of a single type which is the second type or the third type. Thus the shunt control signals are of the second type for means for shunting 15A and 15D, and the shunt control signals are of the third type for means for shunting 15B, 15C, 15G, and 15E.

TABLE 2

| MFS | Shunt Control Signals |
|---|---|
| 15A | 14D, 14B, 14C, 14G |
| 15B | 14B_bar, 14E_bar |
| 15C | 14C_bar, 14F_bar |
| 15D | 14A, 14E, 14F, 14H |
| 15G | 14G_bar, 14H_bar |
| 15E | 14A_bar, 14D_bar |

In many embodiments described herein, the shunt count equals the pole count M plus the throw count N, so that each terminal (pole 11 or throw 12) has a coupled means for shunting 15. In other embodiments, the shunt count may be less than the sum of the pole count M and the throw count N, so that some but not all of the terminals have a coupled means for shunting 15. It may be appropriate to omit the coupled means for shunting 15 for some terminals, depending upon the isolation and insertion loss requirements stated for individual terminals in a specification. FIG. 2A is a simplified schematic circuit diagram of a general 2P4T (DP4T) switching device 10 having a ring topology, in which some but not all of the terminals (poles 11 and throws 12) have a coupled means for shunting 15. In the embodiment of FIG. 2A, each of a plurality of the terminals has a coupled means for shunting 15 that is coupled between plural adjacent series switches 13 for the terminal. In this description and in the appended claims, the term "shunted terminal" means a terminal with a coupled means for shunting 15. In other embodiments herein, such as those of FIGS. 1, 2B, 4, 5, 6, 7, and 10 in which each terminal has a coupled means for shunting 15, each terminal is a shunted terminal. In the embodiment of FIG. 2A, three of the terminals (pole 11A, throw 12A, throw 12C) are unshunted terminals that lack a coupled means for shunting 15, and the other three terminals (pole 11B, throw 12B, throw 12D) are shunted terminals. In other embodiments, other combinations of shunted and unshunted terminals are possible. In one example, each of the poles 11 could be an unshunted terminal and some or all of the throws 12 could be shunted terminals.

In the embodiment of FIG. 2A, each means for shunting 15 receives plural shunt control signals (not depicted). As described in connection with FIGS. 4 and 5, there are several types of shunt control signals. In some embodiments in which some but not all of the terminals are shunted terminals, the shunt control signals may be of a single type for each coupled means for shunting 15. In other words, the same type of shunt control signals may be used for all of the separate means for shunting 15 within a switching device 10. In other embodiments, the shunt control signals may be of different types for the separate means for shunting 15 within a switching device 10; thus, for each shunted terminal the shunt control signals for the coupled means for shunting 15 may be of the first type or the second type or the third type. For an individual means for shunting 15, the shunt control signals are of a single type.

Figure 6:
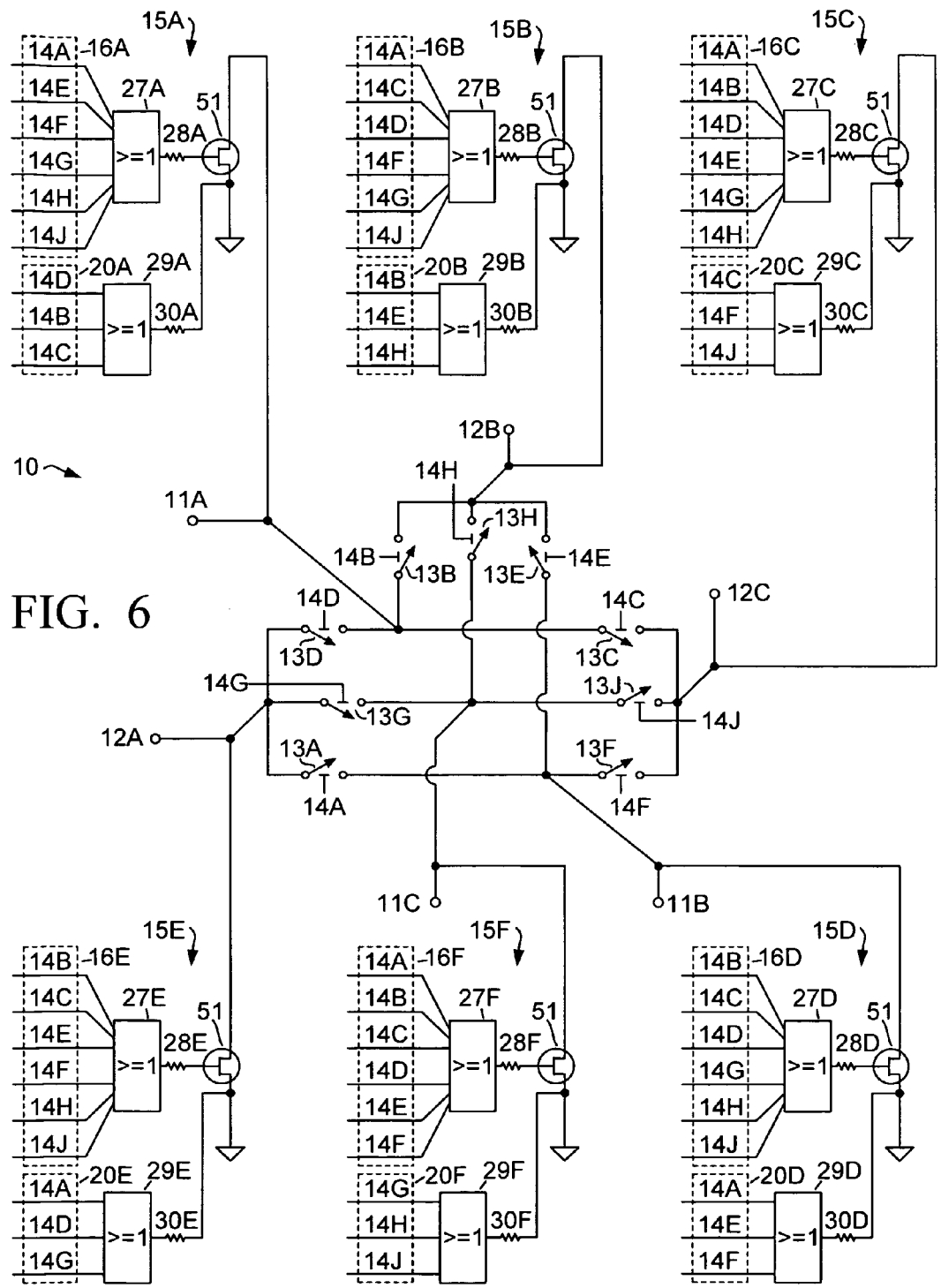
FIG. 6 is a simplified schematic circuit diagram of a 3P3T switching device having a ring topology, in accordance with an embodiment.

FIG. 6 is a simplified schematic circuit diagram of a 3P3T switching device 10 having a ring topology, in accordance with an embodiment. The switching device 10 of FIG. 6 is similar to the general 3P3T switching device 10 of FIG. 4, but differs with respect to circuitry within means for shunting 15 and with respect to shunt control signals received by means for shunting 15. For clarity, FIG. 6 does not depict the control lines that transmit control signals 14 to series switches 13 and to means for shunting 15, but instead depicts only a stub of each control line coupled to a series switch 13 or a means for shunting 15.

Each means for shunting 15 receives plural shunt control signals 16 and also receives plural additional shunt control signals 20. As in the embodiments of FIG. 1 and FIGS. 3A-D, the shunt control signals 16 for the coupled means for shunting 15 include the control signal 14 received by each distant series switch 13 for the terminal. Table 3 identifies the shunt control signals 16 for each means for shunting (MFS) 15 for the 3P3T switching device 10 of FIG. 6.

TABLE 3

| MFS | Shunt Control Signals |
|---|---|
| 15A | 14A, 14E, 14F, 14G, 14H, 14J |
| 15B | 14D, 14A, 14C, 14F, 14G, 14J |
| 15C | 14D, 14A, 14B, 14E, 14G, 14H |
| 15D | 14D, 14B, 14C, 14G, 14H, 14J |
| 15E | 14B, 14E, 14C, 14F, 14H, 14J |
| 15F | 14D, 14A, 14B, 14E, 14C, 14F |

For each terminal, the additional shunt control signals 20 for the coupled means for shunting 15 include the control signal 14 received by each adjacent series switch 13 for the terminal. Table 4 identifies the additional shunt control signals 20 for each means for shunting (MFS) 15 for the 3P3T switching device 10 of FIG. 6.

TABLE 4

| MFS | Additional Shunt Control Signals |
|---|---|
| 15A | 14D, 14B, 14C |
| 15B | 14B, 14E, 14H |
| 15C | 14C, 14F, 14J |
| 15D | 14A, 14E, 14F |
| 15E | 14D, 14A, 14G |
| 15F | 14G, 14H, 14J |

FIG. 3E is a simplified schematic circuit diagram of throw 12A and coupled means for shunting 15E, in accordance with the embodiment of FIG. 6. In the embodiment of FIG. 3E, each means for shunting 15 comprises all of the elements in the means for shunting of FIG. 3D, and further comprises a second OR gate 29 and a resistor 45 that is coupled between OR gate 29 and the source 52 of FET switching element 51. Each means for shunting 15 also includes a capacitor 37 coupled between throw 12A and the drain of the FET switching element 51; capacitor 37 serves as a DC block. As in the embodiments of FIGS. 3C and 3D, OR gate 27 receives plural shunt control signals 16 for means for shunting 15 and generates an output signal 28 that is received at the gate of FET switching element 51 through resistor 43. OR gate 29 receives plural additional shunt control signals 20 for means for shunting 15 and generates a second output signal 30 that is received at the source 52 of FET switching element 51 through resistor 45. Thus, FET switching element 51 receives output signal 28 and second output signal 30. CMOS FETs, MESFETs, and pHEMTs are suitable for implementing the embodiment of FIG. 3E. For example, CMOS FETs, having a pinch-off voltage of +0.7 volts and high and low voltages of +3.0 volts and 0 volts, may be used.

Control signals 14B, 14C, 14E, 14F, 14H and 14J are the shunt control signals 16E for means for shunting 15E that is depicted in FIG. 3E; these control signals 14B, 14C, 14E, 14F, 14H and 14J are the control signals 14 received by each distant series switch 13 for throw 12A. Furthermore, control signals 14D, 14A and 14G are the additional shunt control signals 20E for means for shunting 15E; these control signals 14D, 14A and 14G are the control signals 14 received by each adjacent series switch 13 for throw 12A. In the embodiment of FIGS. 6 and 3E, each of the terminals (pole 11 and throw 12) receives additional shunt control signals 20. As used in this description and in the appended claims, the term "additionally shunted terminal" means a terminal with a coupled means for shunting 15 that receives additional shunt control signals 20. If positive logic is used, and if control signal 14A, for example, has high voltage, then output signal 28E has low voltage and output signal 30E has high voltage. Vgs=Vgate minus Vsource=0 volts minus 3 volts=−3 volts, which is much lower than the pinch-off voltage of +0.7 volts, and switching element 51 is turned off.

Note that switching element 51 is turned off more completely in the embodiment of FIG. 3E, compared to that of FIG. 3C. If means for shunting 15 includes only a single OR gate 27, as in the embodiment of FIG. 3C, switching element 51 will still be turned off if control signal 14A has high voltage. For the embodiment of FIG. 3C, Vgs=Vgate minus Vsource=0 volts minus 0 volts=0 volts, which is lower than the pinch-off voltage of +0.7 volts. However, Vgs for FIG. 3C (0 volts) is much higher than Vgs for FIG. 3E (−3 volts). Thus switching element 51 is turned off more completely in the embodiment of FIG. 3E, so that switching element 51 is tightly closed with minimal leakage.

Power handling and linearity are expected to increase when switching element 51 is tightly closed. The embodiment of FIG. 3E provides higher power handling and higher linearity, compared to the embodiment of FIG. 3C.

The embodiment of FIGS. 6 and 3E may also be used as a multiple transmission mode switching device 10 in which more than one pole-throw path is conducting at the same time. A multiple transmission mode MPNT switching device 10 may be used in a communication device that operates in multiple input multiple output (MIMO) mode. In MIMO mode, two or more paths are conducting at the same time, thereby enabling two or more antennas to transmit or receive signals at the same time.

As described above for various embodiments, for operation of switching device 10 in single transmission mode, one of the control signals 14 has a first value when each of the other control signals 14 has a second value. For example, control signal 14C could have high voltage so that series switch 13C is turned on when each of the other control signals 14 has low voltage so that each of the other switches is turned off. In contrast, for operation of switching device 10 in multiple transmission mode, each of two of the control signals 14 has a first value and each control signal 14 that is not one of the two of the control signals 14 has a second value. For example, control signals 14C and 14A could have high voltage when each of the other control signals 14 has low voltage.

For the embodiment of FIGS. 6 and 3E, if control signals 14C and 14A, for example, both have high voltage, then means for shunting 15A, 15C, 15D and 15E will be turned off (not shunt to ground) while means for shunting 15B and 15F will be turned on (will shunt to ground). The isolation provided by this embodiment in multiple transmission mode is not quite as high as the isolation provided in single transmission mode. However, the isolation provided in multiple transmission mode may be perfectly acceptable for many applications, depending upon the specifications for the applications. To improve isolation characteristics, it may be advantageous to implement series switches 13 using FET switching elements such as those depicted in FIG. 11A-E. In particular, the switching element 60 depicted in FIG. 11E may be used to implement each series switch 13 within a switching device 10 operating in multiple transmission mode. In addition, implementation of series switches 13 using FET switching elements such as those depicted in FIGS. 11A-E can improve power handling and linearity.

Figure 7:
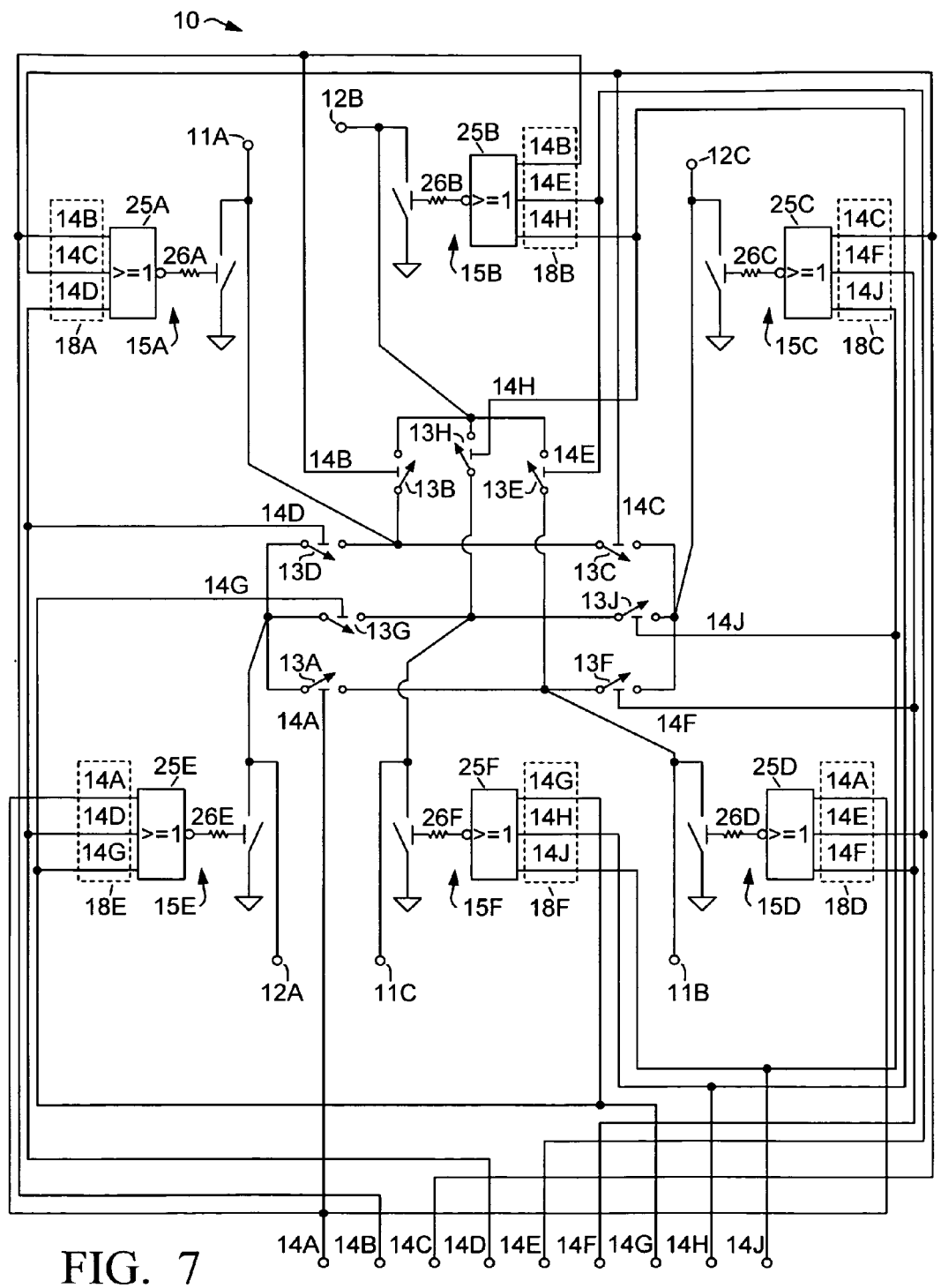
FIG. 7 is a simplified schematic circuit diagram of a 3P3T switching device having a ring topology, in accordance with an embodiment.

FIG. 7 is a simplified schematic circuit diagram of a 3P3T switching device 10 having a ring topology, in accordance with an embodiment. The switching device 10 of FIG. 7 is similar to the general 3P3T switching device 10 of FIG. 4, but differs with respect to circuitry within means for shunting 15 and with respect to shunt control signals 18 received by means for shunting 15. In the embodiment of FIG. 7, for each terminal the shunt control signals 18 for the coupled means for shunting 15 include the control signal 14 received by each adjacent series switch 13 for the terminal. Table 5 identifies the shunt control signals 18 for each means for shunting (MFS) 15 for the 3P3T switching device 10 of FIG. 7.

TABLE 5

| MFS | Shunt Control Signals |
|---|---|
| 15A | 14D, 14B, 14C |
| 15B | 14B, 14E, 14H |
| 15C | 14C, 14F, 14J |
| 15D | 14A, 14E, 14F |
| 15E | 14D, 14A, 14G |
| 15F | 14G, 14H, 14J |

Figure 8A:
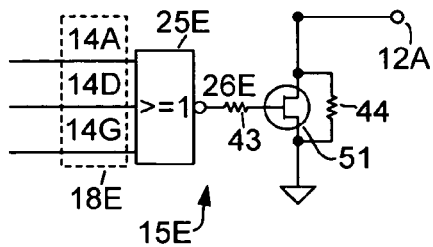
FIG. 8A is a simplified schematic circuit diagram of throw 12A and coupled means for shunting 15E, in accordance with the embodiment of FIG. 7.

FIG. 8A is a simplified schematic circuit diagram of throw 12A and coupled means for shunting 15E, in accordance with the embodiment of FIG. 7. In the embodiment of FIG. 7, each means for shunting 15 comprises a NOR gate 25 and an FET switching element 51. Means for shunting 15 also comprises a resistor 43 that is coupled between NOR gate 25 and FET switching element 51, and a resistor 44 coupled between the source 52 and the drain 53 of FET switching element 51. NOR gate 25 receives shunt control signals 18 for means for shunting 15 and generates an output signal 26. FET switching element 51 receives output signal 26 through resistor 43 and is turned on or off according to the value of output signal 26. For example, control signals 14A, 14D and 14G are the shunt control signals 18E for means for shunting 15E that is depicted in FIG. 8A. If control signal 14A or 14D or 14G has high voltage, then output signal 26E has low voltage and switching element 51 is turned off. Means for shunting 15E does not shunt to ground when adjacent series switch 13A or 13D or 13G is turned on. CMOS FETs, MESFETs, and pHEMTs working at negative control voltages are suitable for implementing the embodiment of FIG. 8A.

In an alternative embodiment (not depicted), NOR gate 25 may be replaced by an OR gate plus an inverter. The OR gate receives shunt control signals 18 for means for shunting 15 and generates a first output signal; the inverter receives the first output signal and generates a second output signal, and switching element 51 receives the second output signal. In another alternative embodiment (not depicted), means for shunting 15 comprises plural switching elements 51 coupled in series and means for inverting each of the shunt control signals 18 to generate complementary shunt control signals. Each of the switching elements 51 receives a separate one of the complementary shunt control signals.

Figure 8B:
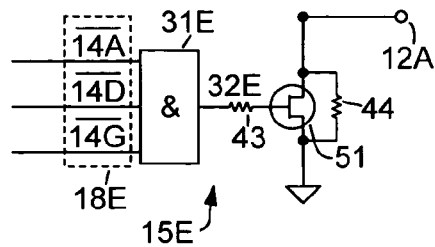
FIG. 8B is a simplified schematic circuit diagram of throw 12A and coupled means for shunting 15E, in accordance with an embodiment.
Figure 8C:
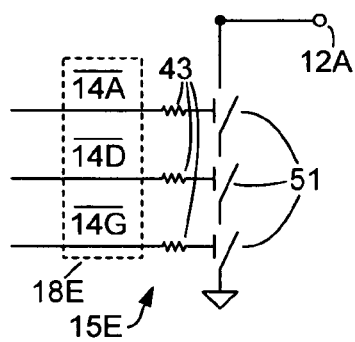
FIG. 8C is a simplified schematic circuit diagram of throw 12A and coupled means for shunting 15E, in accordance with an embodiment.

FIGS. 8B and 8C each pertain to embodiments for which shunt control signals 18 are complementary to control signals 14 received by adjacent series switches 13. In such embodiments, control lines transmit control signals 14 to series switches 13, as in FIGS. 1 and 7. The complementary control signals 14_bar may be generated by inversion of control signals 14, and the complementary control signals 14_bar are transmitted to means for shunting 15. In the embodiments of FIGS. 8B and 8C, for each terminal the shunt control signals 18 for the coupled means for shunting 15 include a signal complementary to the control signal 14 received by each adjacent series switch 13 for the terminal. Table 6 identifies the complementary control signals 14_bar (collectively, the shunt control signals 18) for each means for shunting (MFS) 15 for a 3P3T switching device 10 according to the embodiment of FIG. 8B or the embodiment of FIG. 8C. The means for shunting 15 listed in Table 6 are the same as those depicted in FIG. 7, and the complementary control signals 14_bar are the complements of the control signals 14 depicted in FIG. 7.

TABLE 6

| MFS | Shunt Control Signals |
|---|---|
| 15A | 14D_bar, 14B_bar, 14C_bar |
| 15B | 14B_bar, 14E_bar, 14H_bar |
| 15C | 14C_bar, 14F_bar, 14J_bar |
| 15D | 14A_bar, 14E_bar, 14F_bar |
| 15E | 14D_bar, 14A_bar, 14G_bar |
| 15F | 14G_bar, 14H_bar, 14J_bar |

FIG. 8B is a simplified schematic circuit diagram of throw 12A and coupled means for shunting 15E, in accordance with an embodiment. Means for shunting 15E exemplifies the circuitry for each means for shunting 15 in a switching device 10 according to the embodiment. In the embodiment of FIG. 8B, each means for shunting 15 comprises an AND gate 31 and an FET switching element 51. Means for shunting 15 also comprises a resistor 43 that is coupled between AND gate 31 and FET switching element 51, and a resistor 44 coupled between the source 52 and the drain 53 of FET switching element 51. AND gate 31 receives shunt control signals 18 for means for shunting 15 and generates an output signal 32. FET switching element 51 receives output signal 32 through resistor 43 and is turned on or off according to the value of output signal 32. For example, control signals 14A_bar, 14D_bar and 14G_bar are the shunt control signals 18E for means for shunting 15E that is depicted in FIG. 8B. If control signal 14A has high voltage and control signals 14D and 14G have low voltage, then complementary signal 14A_bar has low voltage, so output signal 32E has low voltage and switching element 51 is turned off. Means for shunting 15E does not shunt to ground when adjacent series switch 13A or 13D or 13G is turned on. CMOS FETs, MESFETs, and pHEMTs working at negative control voltages are suitable for implementing the embodiment of FIG. 8A.

FIG. 8C is a simplified schematic circuit diagram of throw 12A and coupled means for shunting 15E, in accordance with an embodiment. Means for shunting 15E exemplifies the circuitry for each means for shunting 15 in a switching device 10 according to the embodiment. In the embodiment of FIG. 8C, each means for shunting 15 comprises plural switching elements 51 coupled in series, each of the switching elements 51 receiving a separate one of the shunt control signals 18 for the means for shunting. Each switching element 51 receives a separate one of control signals 14A_bar, 14D_bar and 14G_bar (collectively, the shunt control signals 18E) through a resistor 43 that is coupled between each switching element 51 and the control line that transmits the control signal 14 for the switching element 51. The plural switching elements 51 coupled in series (cascaded switching elements 51) are equivalent to an AND logic gate. If control signals 14A, 14D and 14G all have low voltage, then adjacent switches 13A, 13D and 13G are turned off, control signals 14A_bar, 14D_bar and 14G_bar all have high voltage so that each of the switching elements 51 is turned on, and means for shunting 15E shunts to ground. If any one of control signals 14A_bar, 14D_bar, 14G_bar has low voltage, then means for shunting 15E does not shunt to ground.

FIGS. 8D-8G depict means for shunting 15E for alternative embodiments of the switching device 10 of FIG. 7. For each alternative embodiment, each means for shunting 15 receives the same shunt control signals 18 as for the embodiment of FIG. 7. Thus, the embodiments of FIGS. 8D-8G do not use the complementary control signals 14_bar that are used by the embodiments of FIGS. 8B and 8C. The switching elements 51 in the embodiments of FIGS. 8D-8G use negative logic, thus avoiding the need to generate complementary control signals 14_bar. Table 5 (presented above) identifies the shunt control signals 18 for each means for shunting 15 for the 3P3T switching device 10 of FIG. 7.

Figure 8D:
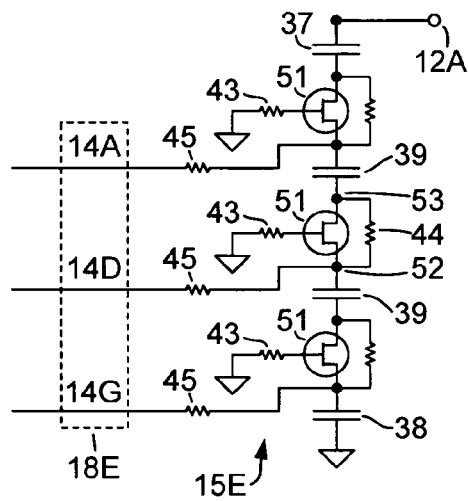
FIG. 8D is a simplified schematic circuit diagram of throw 12A and coupled means for shunting 15E, in accordance with an embodiment.

FIG. 8D is a simplified schematic circuit diagram of throw 12A and coupled means for shunting 15E, in accordance with an embodiment. In the embodiment of FIG. 8D, each means for shunting 15 comprises plural field effect transistor (FET) switching elements 51 coupled in series, each FET switching element 51 having a source 52 and a drain 53. For clarity, the reference numbers for the source 52 and the drain 53 and for source-drain resistor 44 are indicated for only one of the three FET switching elements 51 in FIG. 8D. Each FET switching element 51 receives a separate one of the shunt control signals 18 for the means for shunting 15. For each FET switching element 51 the shunt control signal 18 for the FET switching element 51 is received at the source 52 or at the drain 53. In the embodiment of FIG. 8D, each shunt control signal 18 is received through a resistor 45 at the source 52. Means for shunting 15 includes three resistors for each FET switching element 51: a resistor 43 that is coupled between the gate of the FET switching element 51 and ground, and a resistor 45 that is coupled between the control line that transmits the shunt control signal 18 and the source 52 or drain 53 that receives the shunt control signal 18, and a resistor 44 coupled between the source 52 and the drain 53 of FET switching element 51. Capacitors 37, 39 and 38 within means for shunting 15 are coupled in series with the drain 53 and source 52 of the FET switching elements 51. Capacitors 37, 39 and 38 block DC potentials so that individual FET switching elements 51 can be controlled by the control signal 14 received at the source 52.

The embodiment of FIG. 8D operates as described here for means for shunting 15E. GaAs pHEMTs are suitable for implementing the embodiment of FIG. 8D. FET switching elements 51 each receive one of the control signals 14A, 14D and 14G (collectively, shunt control signals 18E). FET switching elements 51 use negative logic. Each control signal 14 is received at the source 52 of one of the FET switching elements 51. The gate for each FET switching element 51 is coupled to ground so Vgate=0 volts. For any of the FET switching elements 51, if the control signal 14A, D or G has high voltage, then Vsource is high, so Vgate minus Vsource has a large negative value which is less than the GaAs pHEMT typical pinch-off voltage of −0.5 to −1.0 volts, and the FET switching element 51 is turned off. If any of the three FET switching elements 51 is turned off, means for shunting 15E does not shunt to ground. Alternatively, if all of the control signals 14A, 14d and 14G have low voltage (0 volts), then for each FET switching element 51 Vgate minus Vsource=0 volts−0 volts=0 volts, which is greater than the GaAs pHEMT typical pinch-off voltage of −0.5 to −1.0 volts, and all of the FET switching elements 51 are turned on. If all three FET switching elements 51 are turned on, means for shunting 15E shunts to ground.

Figure 8E:
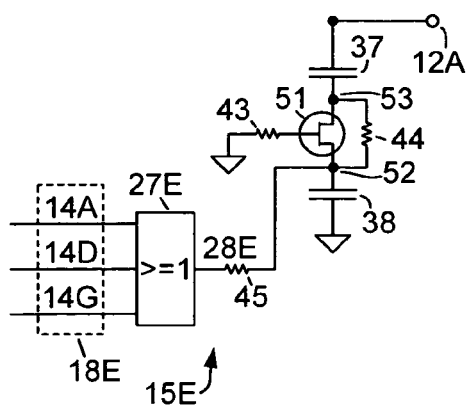
FIG. 8E is a simplified schematic circuit diagram of throw 12A and coupled means for shunting 15E, in accordance with an embodiment.
Figure 8F:
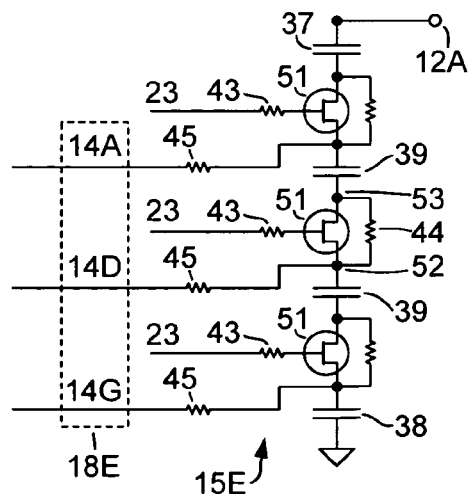
FIG. 8F is a simplified schematic circuit diagram of throw 12A and coupled means for shunting 15E, in accordance with an embodiment.

FIG. 8E is described after FIGS. 8F and 8G. CMOS FETs may be used to implement an alternative embodiment, depicted in FIG. 8F, that is very similar to the embodiment of FIG. 8D. In the embodiment of FIG. 8F, the gate of each FET switching element 51 is not coupled to ground. Instead, each FET gate receives a fixed high voltage 23 through gate resistor 43. For CMOS FETs using positive logic, the fixed high voltage that is received at each FET gate has a lower value than the high control voltage. For example, if the CMOS control voltages are 0 volts and 5 volts, the fixed high voltage may be set to 3 volts.

FIG. 8G depicts another embodiment that is very similar to the embodiment of FIG. 8D. In the embodiment of FIG. 8G, shunt control signals 18E are received at OR gate 27E which outputs signal 28E. Signal 28E is received through a resistor 45 at the source 52 of each of the three FET switching elements 51. The embodiment of FIG. 8G provides increased power handling and linearity compared to the embodiment of FIG. 8D, for the following reason. If control signal 14A, for example, has high voltage, then signal 28E will have high voltage, causing all three FET switching elements 51 to be turned off. In the embodiment of FIG. 8D, in contrast, only one switching element 51 is turned off when control signal 14A has high voltage. Power handling and linearity are increased when three FET switching elements 51 in series are turned off. The embodiment of FIG. 8G may be implemented using GaAs FETs with negative pinch-off voltage.

CMOS FETS may be used to implement an alternative embodiment that is very similar to the embodiment of FIG. 8G. In the alternative embodiment, the gate of each FET switching element 51 receives a fixed high voltage 23 through gate resistor 43, as in the embodiment of FIG. 8F. For CMOS FETs using positive logic, the fixed high voltage that is received at each FET gate has a lower value than the high control voltage. For example, if the CMOS control voltages are 0 volts and 5 volts, the fixed high voltage may be set to 3 volts.

FIG. 8E is a simplified schematic circuit diagram of throw 12A and coupled means for shunting 15E, in accordance with an embodiment. In the embodiment of FIG. 8E, each means for shunting 15 comprises an OR gate 27 and an FET switching element 51, the FET switching element 51 having a source 52 and a drain 53. OR gate 27 receives control signals 14 (collectively, shunt control signals 18) and generates an output signal 28. FET switching element 51 receives output signal 28 through resistor 45 at the source 52 or at the drain 53. Means for shunting 15 includes a resistor 43 that is coupled between the gate of the FET switching element 51 and ground, and a resistor 45 that is coupled between the control line that transmits the shunt control signal 18 and the source 52 or drain 53 that receives the shunt control signal 18. Capacitors 37 and 38 within means for shunting 15 are coupled in series with the drain 53 and source 52 of the FET switching elements 51 to block DC potentials so that individual FET switching elements 51 can be controlled by the control signal 14 received at the source 52.

The embodiment of FIG. 8E operates as described here for means for shunting 15E. GaAs pHEMTs are suitable for implementing the embodiment of FIG. 8E. OR gate 27 receives control signals 14A, 14D and 14G (collectively, shunt control signals 18E) and generates ouput signal 28. The gate for FET switching element 51 is coupled to ground so Vgate=0 volts. If any of control signals 14A, 14D or 14G is high, output signal 28 is high so Vsource for FET switching element 51 is high. Vgate minus Vsource has a large negative value which is less than the GaAs pHEMT typical pinch-off voltage of −0.5 to −1.0 volts, and FET switching element 51 is turned off. Alternatively, if all of the control signals 14A, 14D and 14G are low, then output signal 28 is low so Vsource for FET switching element 51 has low voltage (0 volts). Vgate minus Vsource=0 volts−0 volts=0 volts, which is greater than the GaAs pHEMT typical pinch-off voltage of −0.5 to −1.0 volts, and FET switching element 51 is turned on.

The embodiments of FIGS. 7 and 8A-8G may also be used as a multiple transmission mode switching device 10 in which more than one pole-throw path is conducting at the same time. A multiple transmission mode MPNT switching device 10 may be used in a communication device that operates in multiple input multiple output (MIMO) mode. In MIMO mode, two or more paths are conducting at the same time, thereby enabling two or more antennas to transmit or receive signals at the same time.

As described in connection with FIGS. 6 and 3E, for operation of switching device 10 in multiple transmission mode, each of two of the control signals 14 has a first value and each control signal 14 that is not one of the two of the control signals 14 has a second value. For example, control signals 14C and 14A could have high voltage when each of the other control signals 14 has low voltage.

For the embodiments of FIGS. 7 and 8A-E, if control signals 14C and 14A, for example, both have high voltage, then means for shunting 15A, 15C, 15D and 15E will be turned off (not shunt to ground) while means for shunting 15B and 15F will be turned on (will shunt to ground). The isolation provided by this embodiment in multiple transmission mode is not quite as high as the isolation provided in single transmission mode. However, the isolation provided in multiple transmission mode may be perfectly acceptable for many applications, depending upon the specifications for the applications. To improve isolation characteristics, it may be advantageous to implement series switches 13 using FET switching elements such as those depicted in FIG. 11A-E. In particular, the switching element 60 depicted in FIG. 11E may be used to implement each series switch 13 within a switching device 10 operating in multiple transmission mode. In addition, implementation of series switches 13 using FET switching elements such as those depicted in FIGS. 11A-E can improve power handling and linearity.

Figure 2B:
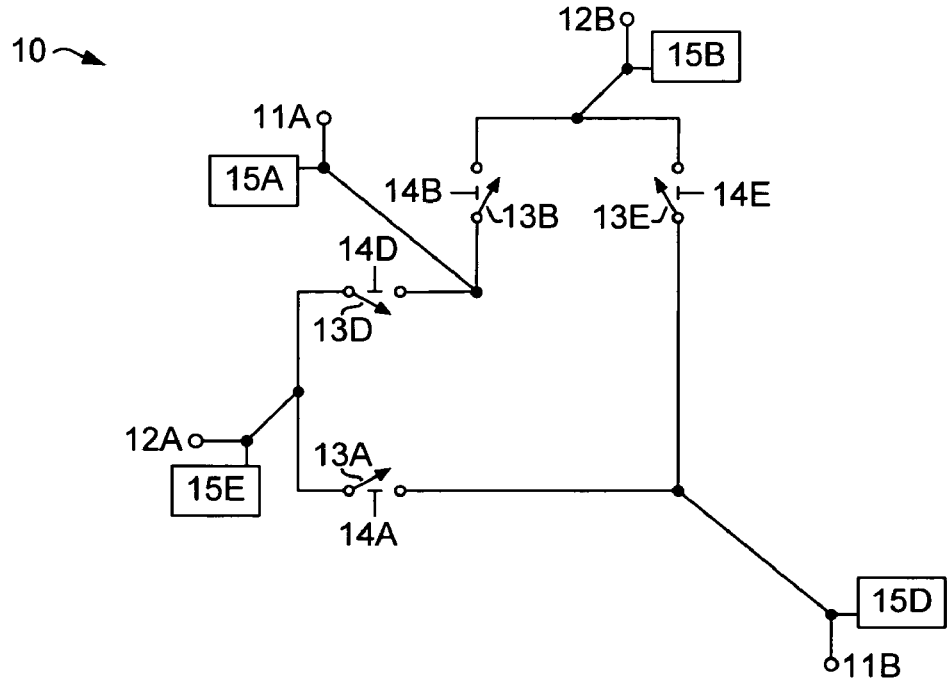
FIG. 2B is a simplified schematic circuit diagram of a 2P2T switching device having a ring topology.

In other embodiments similar to those of FIGS. 7 and 8A-G, the pole count M and the throw count N may be larger or smaller than for the embodiments of FIG. 7 and FIGS. 8A-G. The simplest embodiment is a 2P2T (DPDT) switching device 10 having a series switch count of four and a shunt count of four. In this 2P2T embodiment, each means for shunting 15 has two adjacent series switches 13, so the means for shunting 15 would receive two shunt control signals 18. FIG. 2B depicts a general 2P2T (DPDT) switching device 10 having a series switch count of four and a shunt count of four.

Figure 10:
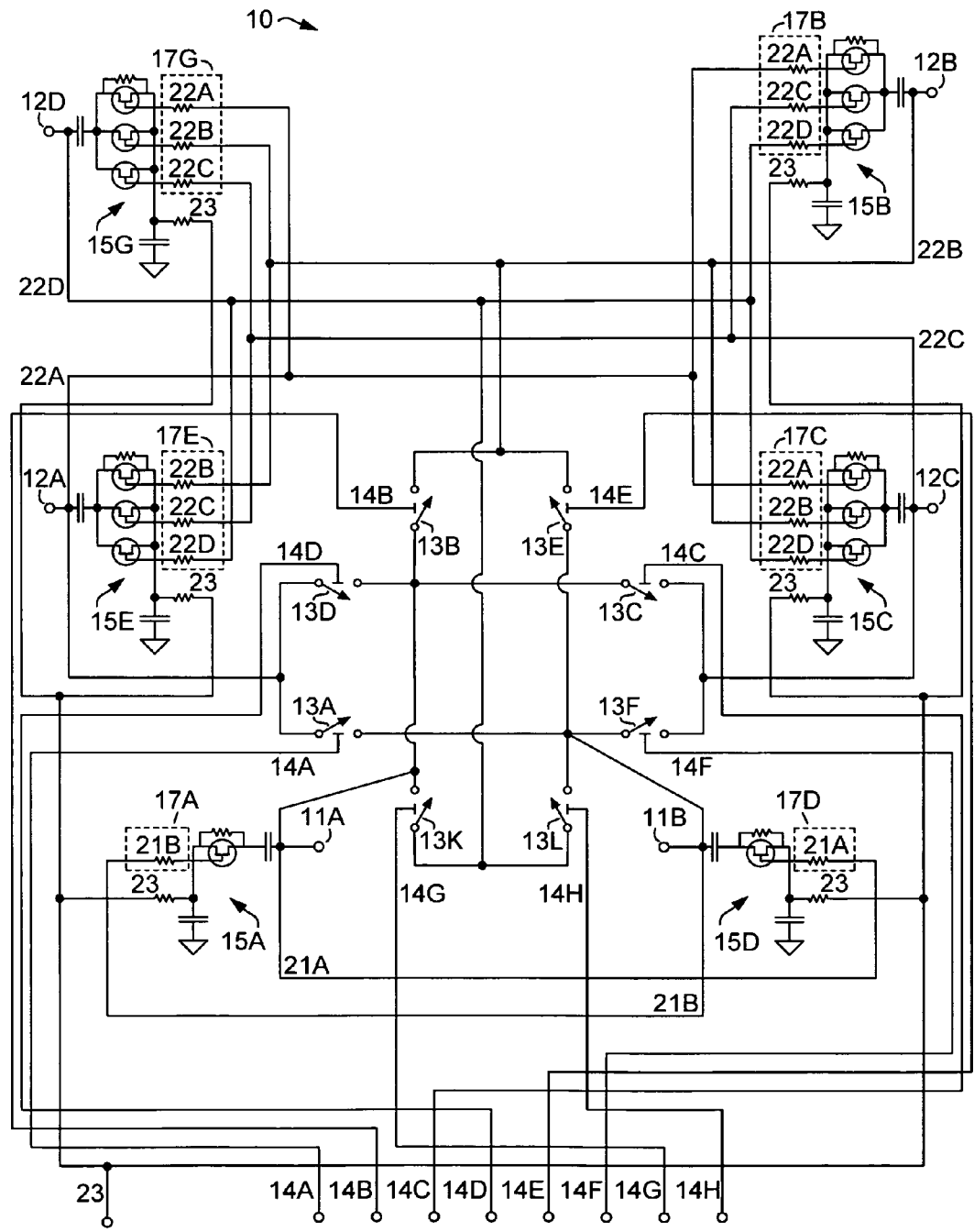
FIG. 10 is a simplified schematic circuit diagram of a 2P4T switching device having a ring topology, in accordance with an embodiment.

FIG. 10 is a simplified schematic circuit diagram of a 2P4T (DP4T) switching device 10 having a ring topology, in accordance with an embodiment. In this 2P4T embodiment, there are four throws 12; in other words, the throw count is four. The switching device 10 of FIG. 10 is similar to the general 2P4T switching device 10 of FIG. 5, but differs with respect to circuitry within means for shunting 15 and with respect to shunt control signals 17 received by means for shunting 15. In the depiction of FIG. 10, the terminals (poles 11 and throws 12) and coupled means for shunting 15 have been positioned so that the four throws 12 are in the upper portion of FIG. 10 and the two throws 11 are in the lower portion of FIG. 10. In the embodiment of FIG. 10, each pole 11 has a pole DC potential 21 and each throw 12 has a throw DC potential 22. In this description and in the appended claims, the terms "pole DC potential" and "throw DC potential" have the following meanings. A pole DC potential 21 for a pole 11 is the DC voltage at that pole 11, and a throw DC potential 22 for a throw 12 is the DC voltage at that throw 12. For example, pole 11A has pole DC potential 21A, and throw 12A has throw DC potential 22A.

In the embodiment of FIG. 10, for each pole 11 the shunt control signals 17 for the coupled means for shunting include the pole DC potential 21 for each distant pole, and for each throw 12 the shunt control signals 17 for the coupled means for shunting include the throw DC potential 22 for each distant throw. Each means for shunting 15 receives at least one shunt control signals 17. In this description and in the appended claims, the terms "distant pole" and "distant throw" have the following meanings. With respect to a specific pole 11, the distant poles include every other pole 11 that is not the specific pole 11. With respect to a specific throw 12, the distant throws include every other throw 12 that is not the specific throw 12. For example, pole 11B is the distant pole for pole 11A. For example, throws 12B, 12C and 12D are the distant throws for throw 12A. Table 7 identifies the shunt control signals 17 for each means for shunting (MFS) 15 for the 2P4T switching device 10 of FIG. 10.

TABLE 7

| MFS | Shunt Control Signals |
|---|---|
| 15A | 21B |
| 15B | 22A, 22C, 22D |
| 15C | 22A, 22B, 22D |
| 15D | 21A |
| 15E | 22B, 22C, 22D |
| 15G | 22A, 22B, 22C |

FIG. 9A is a simplified schematic circuit diagram of pole 11A and coupled means for shunting 15A, in accordance with the embodiment of FIG. 10. Similarly, FIG. 9B is a simplified schematic circuit diagram of throw 12A and coupled means for shunting 15E, in accordance with the embodiment of FIG. 10. GaAs FETs (pHEMTs or MESFETs) are suitable for implementing the embodiment of FIGS. 10, 9A and 9B. Means for shunting 15A includes a single FET switching element 51 that receives at its gate pole DC potential 21B (shunt control signal 17A). Means for shunting 15E includes three FET switching elements 51 coupled in a parallel configuration, each of the FET switching elements 51 receiving at its gate a separate one of the shunt control signals 17E, which include throw DC potentials 22B, 22C and 22D. Each means for shunting 15 also receives, at the source 52 of the FET switching element(s) 51, an additional signal 23. Each means for shunting 15 also includes a resistor 44 coupled between source 52 and drain 53 of the FETs, and two capacitors 37 and 38, and two resistors 43 and 45 through which shunt control signals 17 are received.

As noted above, each pole 11 has a pole DC potential 21 and each throw 12 has a throw DC potential 22. When a series switch 13 is turned on (conducting), the path that includes the series switch 13 will be at high DC voltage. The high voltage within the conducting path will extend to any pole 11 or throw 12 that is within the conducting path. Thus for any pole 11, the pole DC potential 21 will be at high voltage if any of the series switches 13 adjacent to the pole 11 is at high voltage. Similarly, for any throw 12, the throw DC potential 22 will be at high voltage if any of the series switches 13 adjacent to the throw 22 is at high voltage. Thus, the value of each pole DC potential 21 or throw DC potential 22 is governed by whether each adjacent series switch 13 is turned on or off.

The embodiment of FIG. 10 operates as described here, using GaAs pHEMTs and positive logic, with high voltage of 3 volts and low voltage of 0 volts. Additional signal 23 is a fixed or supply voltage whose value must be selected carefully as described here. For a GaAs-based FET switching element, when the FET gate is biased at a positive high voltage Vgate, the source and drain voltages Vsource and Vdrain are high but slightly lower than Vgate. In a typical example, delta=Vgate minus Vsource=0.2–0.4 volts, an average of 0.3 volts. For example, when Vgate is 3 volts, Vsource and Vdrain are each about 2.6-2.8 volts. For a series switch 13 that is implemented using such an FET switching element, the adjacent pole 11 and throw 12 are coupled to the source and drain of the FET switching element. Thus, when the series switch 13 is ON with Vgate of 3 volts, the adjacent pole 11 and throw 12 each have a DC potential of about 2.6-2.8 volts. The DC potentials at distant poles 11 and throws 12 have voltages that differ from the DC potentials at the adjacent poles 11 and throws 12. When Vgate is high, the DC potentials at distant poles 11 and throws 12 are neither high nor low, but have an intermediate value (eg 1.5 volts) whose value depends upon which GaAs process is used for implementation.

If series switch 13A is ON and all other series switches 13B-H are OFF, pole DC potential 21A and throw DC potentials 22B, 22C and 22D each have a value of about 1.5 volts. For means for shunting 15E, the shunt control signals 17E are throw DC potentials 22B, 22C and 22D, so Vgate for each FET switching element 51 is about 1.5 volts. Vsource or Vdrain is supplied by the additional signal 23 which has a fixed high voltage of, for example, 3 volts. Vgs=Vgate minus Vsource=1.5 volts minus 3 volts=negative 1.5 volts, and this voltage is below the typical GaAs pHEMT pinch-off voltage of negative 0.5 to negative 1.0 volts, so each FET switching element 51 is turned off. Means for shunting 15E does not shunt to ground when adjacent series switch 13A is turned on. Similarly, means for shunting 15D, which receives pole DC potential 21A, does not shunt to ground when adjacent series switch 13A is turned on.

Means for shunting 15A, 15B, 15C, and 15G are not adjacent to series switch 13A which is ON. For means for shunting 15A, the shunt control signals 17A include pole DC potential 21B with value 2.7 volts, assuming that delta equals 0.3 volts. For means for shunting 15B, 15C, and 15G, the shunt control signals 17 include throw DC potential 22A with value 2.7 volts. For switching elements 51 that receive a gate bias of 2.7 volts and that receive additional signal 23 at the FET source, Vgs=Vgate minus Vsource=2.7 volts minus 3 volts=negative 0.3 volts, and this value is above the typical GaAs pHEMT pinch-off voltage Vp of negative 0.5 to negative 1.0 volts, so each FET switching element 51 is turned on. Means for shunting 15A, 15B, 15C, and 15G shunt to ground when series switch 13A is turned on.

It is advantageous to choose the values of Vp and additional signal 23 as described here. The preceding description assumed that delta equals 0.3 volts and that the pinch-off voltage Vp is in the range of negative 0.5 to negative 1.0 volts. The specific values of Vp and delta are determined by the process used to implement the FETs. If delta equals 0.4 volts and Vp equals negative 0.5 volts, then for FETs that receive DC potentials 21B or 22A, Vgs=Vgate minus Vsource=2.6 volts minus 3.0 volts=negative 0.4 volts, which is only marginally higher than Vp, so switching element 51 is turned on but only marginally. To improve the situation, instead of setting additional signal 23 to equal Vhigh, additional signal 23 can be set to equal Vhigh minus delta. For example, if delta is 0.3 volts, then additional signal 23 equals 3 volts minus 0.3 volts=2.7 volts. Then Vgs=Vgate minus Vsource=2.7 volts minus 2.7 volts=0 volts, which is well above Vp which is negative 0.5 volts. These values for Vp and for additional signal 23 are also compatible with correct function of FETs that receive DC potentials 21A, 22B, 22C or 22D, each of which has value of about 1.5 volts. For these FETs, Vgs=Vgate minus Vsource=1.5 volt minus 2.7 volts=negative 1.2 volts, which is less than Vp which equals negative 0.5 volts, so each FET switching element 51 is turned on, as is appropriate.

The series switches 13 in the embodiment of FIG. 10 may be implemented using FET switching elements 51 such as those depicted in FIGS. 11A-E, but for the embodiment of FIG. 10 the source-drain resistor 44 should be omitted from the FET switching elements used in the series switches 13. If the source-drain resistor 44 were included in series switches 13, the DC potentials at all of the poles 11 and throws 12 would have high voltage, which is not compatible with the embodiment of FIG. 10.

In an alternative embodiment very similar to that of FIG. 10, for each throw 12 the plural switching elements in each means for shunting 15B, C, E and G are replaced by an OR gate and a single FET switching element 51. The OR gate receives the shunt control signals 17 for the means for shunting 15 and generates an output signal. The switching element 51 receives the output signal and is turned on or off depending upon the value of Vgs=Vgate minus Vsource, where Vsource is high (3 volts) because of additional signal 23.

In other embodiments similar to those of FIGS. 10 and 9A-B, the pole count M and the throw count N may be larger or smaller than for the embodiments of FIGS. 10 and 9A-B. The simplest embodiment is a 2P2T (DPDT) switching device 10 having a series switch count of four and a shunt count of four. In this 2P2T embodiment, each pole 11 or throw 12 receives one shunt control signal 17, corresponding to the pole DC potential 21 or throw DC potential 22 for the one distant pole or distant throw. FIG. 2B depicts a general 2P2T (DPDT) switching device 10 having a series switch count of four and a shunt count of four.

FIGS. 11A-E depict various field effect transistor (FET) switching elements. FETs may be used as switching elements within series switches 13 or as switching elements 51 within means for shunting 15. A multi-gate FET or plural single-gate FETs in series may be used, for example, rather than a single-gate FET. In the FET examples depicted in FIGS. 11A-e, a single signal controls all of the FETs within the switching element. For each switching element depicted in FIGS. 11A-E, the signal that controls the FETs is received through a resistor 47. In some of the other embodiments depicted herein, such as some of the switching elements 51 within means for shunting 15, there may be more than one signal that controls the switching elements 51 within the means for shunting 15.

FIG. 11A depicts a switching element 55 that includes four single-gate FETs 57 in series, each single-gate FET 57 coupled to a gate resistor 43. Switching element 55 may also include a source-drain resistor 44 for each single-gate FET 57 and capacitors 40, as depicted in FIG. 11A. FIG. 11B depicts a multi-gate FET 56, each gate coupled to a gate resistor 43. A source-drain resistor 44 and capacitors 40 may also be coupled to multi-gate FET 56, as depicted in FIG. 11B. FIG. 11C depicts a switching element 58 that includes three multi-gate FETs 56, plural gate resistors 43, three source-drain resistors 44, and capacitors 40. FIG. 11D depicts a switching element 58 that is the same as that depicted in FIG. 11C except that a single source-drain resistor 44 is used instead of separate source-drain resistors 44 for each multi-gate FET 56.

Figure 11E:
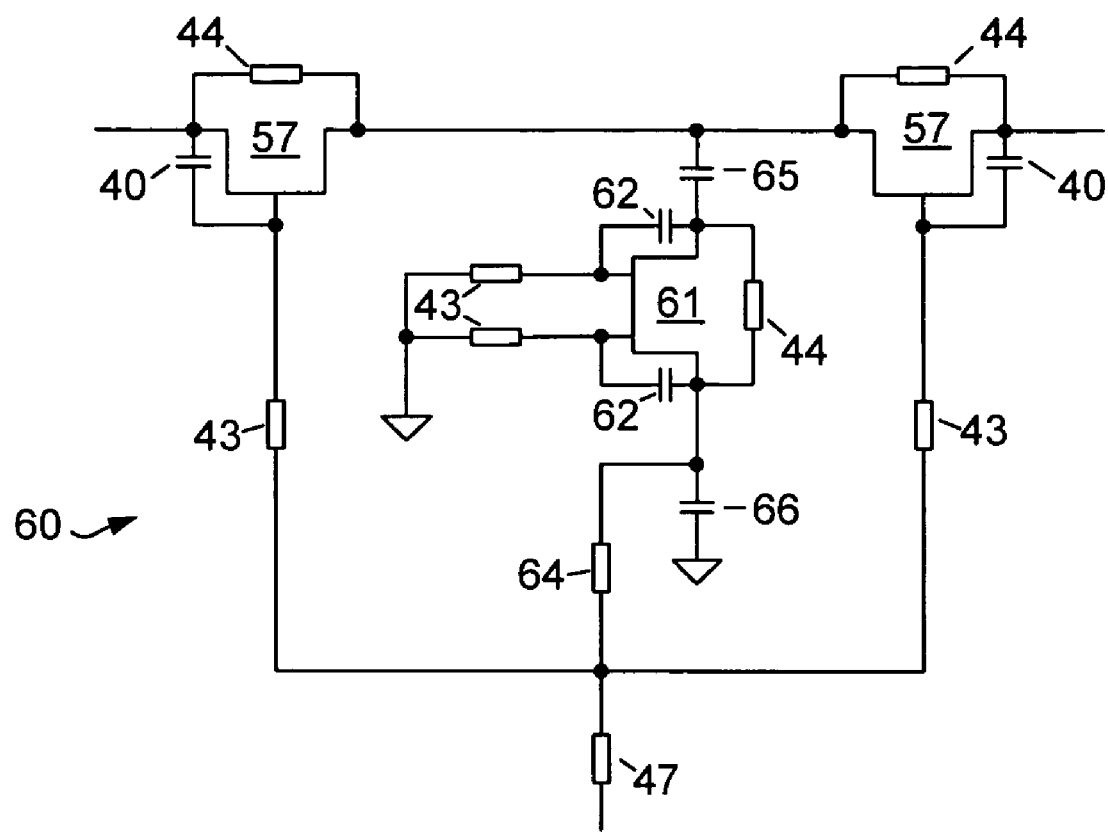
FIG. 11E depicts a switching element 60 that includes three FETs in a series-shunt-series configuration.

As in each of FIGS. 11A-E, source-drain resistors 44 and capacitors 40 may be included or not, depending upon the specific application. FIG. 11E depicts a switching element 60 that includes three FETs in a series-shunt-series configuration, each FET coupled to one or more gate resistors 43. Single-gate FETs 57 are the series elements in this configuration, while multi-gate FET 61 is part of the shunt element in this configuration. Alternatively, single-gate FETs 57 in FIG. 11E may be replaced by a multi-gate FET 61, or by a combination of plural single-gate FETs and plural multi-gate FETs. The shunt element also includes a source-coupled resistor 64 and several capacitors 62, 65, and 66 Switching element 60 provides reasonably high isolation. Switching element 60 may be advantageous when used in place of each series switch 13 in a switching device 10 that operates in multiple transmission mode.

Tables 8-11 presents the results of simulating several circuit designs. Each simulated design is for a 2P4T (DP4T) switching device 10 operating in single mode (a single pole-throw conducting path). The designs of Tables 8 and 9 included series switches 13 modeled as series-only switching elements, similar to that depicted in FIG. 11C. The designs of Tables 10 and 11 included series switches 13 modeled as series-shunt-series switching elements, similar to that depicted in FIG. 11E. The designs of Tables 9 and 11 included a coupled means for shunting (MFS) 15 for each terminal, the modeled means for shunting 15 being similar to that of FIG. 8E. Simulation results are presented for a range of frequencies ("freq") from 1.0 to 6.0 GHz. For all results, the units are negative dB. For each table, the insertion loss ("IL") results are for the single pole-throw conducting path. The isolation results are the range of isolations determined for all pairs of terminals (pole-pole, pole-throw, throw-throw) that are not the pole-throw pair for the conducting path. The simulation did not include the effects of electrical magnetic coupling. If such effects were included, isolation results having magnitudes greater than 90 dB would be reduced to smaller magnitudes. For the 1 to 6 GHz frequency range, most insertion loss values are between −1.3 dB and −1.6 dB. For the designs that include means for shunting 15, and for the 1 to 6 GHz frequency range, isolation values are between 40 dB and over 100 dB.

TABLE 8 series-only, no MFS

| freq | IL | isolation |
|---|---|---|
| 1.0 | 1.37 | 34 to 70 |
| 2.0 | 1.38 | 28 to 57 |
| 3.0 | 1.39 | 24 to 50 |
| 4.0 | 1.40 | 22 to 45 |
| 5.0 | 1.42 | 20 to 41 |
| 6.0 | 1.44 | 18 to 38 |

TABLE 9 series-only, with MFS

| freq | IL | isolation |
|---|---|---|
| 1.0 | 1.36 | 40 to 77 |
| 2.0 | 1.37 | 39 to 75 |
| 3.0 | 1.38 | 39 to 81 |
| 4.0 | 1.39 | 41 to 81 |
| 5.0 | 1.41 | 43 to 84 |
| 6.0 | 1.44 | 39 to 82 |

TABLE 10

| series-shunt-series, no MFS | | |
|---|---|---|
| 1.0 | 1.17 | 59 to 119 |
| 2.0 | 1.19 | 54 to 110 |
| 3.0 | 1.24 | 52 to 106 |
| 4.0 | 1.30 | 52 to 106 |
| 5.0 | 1.39 | 50 to 101 |
| 6.0 | 1.51 | 44 to 89 |

TABLE 11

| series-shunt-series, with MFS | | |
|---|---|---|
| 1.0 | 1.32 | 59 to 118 |
| 2.0 | 1.35 | 55 to 109 |
| 3.0 | 1.40 | 55 to 105 |
| 4.0 | 1.48 | 53 to 103 |
| 5.0 | 1.58 | 51 to 100 |
| 6.0 | 1.71 | 49 to 95 |

Many different embodiments of switching device 10 and means for shunting 15 are described herein. As noted above, it is understood that different embodiments of means for shunting 15 may be combined within a switching device 10. For example, the coupled means for shunting 15 for individual poles 11 and throws 12 might be implemented using different embodiments of means for shunting 15 described herein. For example, several of the embodiments of FIGS. 3A-F might be used within a single switching device 10, or several of the embodiments of FIGS. 8A-G might be used within a single switching device 10. As noted above, more than one type of shunt control signal may be used within a switching device 10. Furthermore, the specification for a switching device 10 may state different isolation and insertion loss requirements for individual poles 11 and throws 12 within the switching device 10. As a result, there may be specifications and switching devices 10 for which it is appropriate to omit the coupled means for shunting 15 for one or more of the poles 11 or throws 12.

Although we have described in detail various embodiments, other embodiments and modifications will be apparent to those of skill in the art in light of this text and accompanying drawings. The following claims are intended to include all such embodiments, modifications and equivalents.

What is claimed is:

1. A switching device comprising:
at least five terminals, the terminals including at least two poles and at least three throws;
a plurality of series switches, a series switch count equalling a pole count M multiplied by a throw count N, each series switch receiving a control signal, each series switch being coupled between one of the poles and one of the throws, wherein each pole is operably coupled to each throw through one of the series switches;
a plurality of means for shunting, a shunt count equalling the pole count M plus the throw count N, each means for shunting receiving plural shunt control signals;
wherein for each terminal one of the means for shunting is coupled between plural adjacent series switches for the terminal, the one of the means for shunting being a coupled means for shunting for the terminal; and
wherein for each terminal the shunt control signals for the coupled means for shunting include the control signal received by each distant series switch for the terminal.

2. The switching device of claim 1,
wherein at least one of the means for shunting comprises plural switching elements, each of the switching elements receiving a separate one of the shunt control signals for the means for shunting.

3. The switching device of claim 1,
wherein at least one of the means for shunting comprises an OR gate and a switching element, the OR gate receiving the shunt control signals for the means for shunting, the OR gate generating an output signal, the switching element receiving the output signal.

4. The switching device of claim 3,
wherein the switching element has a source and the output signal is received at the source or at the drain; and
wherein a fixed high voltage is applied at the terminal that has the coupled means for shunting that comprises an OR gate and the switching element that receives the output signal at the source or at the drain.

5. The switching device of claim 3,
wherein the at least one means for shunting that comprises an OR gate receives plural additional shunt control signals, the terminal with the coupled means for shunting that receives additional shunt control signals being an additionally shunted terminal;
wherein for each additionally shunted terminal the additional shunt control signals for the coupled means for shunting include the control signal received by each adjacent series switch for the additionally shunted terminal.

6. The switching device of claim 1,
wherein each of two of the control signals has a first value and each control signal that is not one of the two of the control signals has a second value.

7. A switching device comprising:
at least four terminals, the terminals including at least two poles and at least two throws;
a plurality of series switches, a series switch count equalling a pole count M multiplied by a throw count N, each series switch receiving a control signal, each series switch being coupled between one of the poles and one of the throws, wherein each pole is operably coupled to each throw through one of the series switches;
a plurality of means for shunting, a shunt count equalling the pole count M plus the throw count N, each means for shunting receiving plural shunt control signals;
wherein for each terminal one of the means for shunting is coupled between plural adjacent series switches for the terminal, the one of the means for shunting being a coupled means for shunting for the terminal; and
wherein for each terminal the shunt control signals for the coupled means for shunting include:
the control signal received by each adjacent series switch for the terminal; or
a signal complementary to the control signal received by each adjacent series switch for the terminal.

8. The switching device of claim 7,
wherein the at least two throws comprise at least three throws.

9. The switching device of claim 8,
wherein the shunt control signals are of a single type.

10. The switching device of claim 8,
wherein at least one of the means for shunting comprises a NOR gate and a switching element, the NOR gate receiving the shunt control signals for the means for shunting, the NOR gate generating an output signal, the switching element receiving the output signal.

11. The switching device of claim 8,
wherein at least one of the means for shunting comprises an OR gate, an inverter, and a switching element, the OR gate receiving the shunt control signals for the means for shunting, the OR gate generating a first output signal, the inverter receiving the first output signal and generating a second output signal, the switching element receiving the second output signal.

12. The switching device of claim 8,
wherein at least one of the means for shunting comprises:
means for inverting each of the shunt control signals for the means for shunting to generate complementary shunt control signals; and
plural switching elements coupled in series, each of the switching elements receiving a separate one of the complementary shunt control signals.

13. The switching device of claim 8,
wherein at least one of the means for shunting comprises plural field effect transistors coupled in series, each field effect transistor receiving a separate one of the shunt control signals for the means for shunting, each field effect transistor having a source and a drain, wherein for each field effect transistor the shunt control signal for the field effect transistor is received at the source or at the drain.

14. The switching device of claim 8,
wherein at least one of the means for shunting comprises an OR gate and a field effect transistor, the field effect transistor having a source and a drain, the OR gate receiving the shunt control signals for the means for shunting, the OR gate generating an output signal, the field effect transistor receiving the output signal at the source or at the drain.

15. The switching device of claim 8,
wherein each of two of the control signals has a first value and each control signal that is not one of the two of the control signals has a second value.

16. The switching device of claim 8,
wherein for at least one of the terminals a fixed high voltage is applied at the terminal.

17. The switching device of claim 8,
wherein at least one of the means for shunting comprises an AND gate and a switching element, the AND gate receiving the shunt control signals for the means for shunting, the AND gate generating an output signal, the switching element receiving the output signal.

18. The switching device of claim 8,
wherein at least one of the means for shunting comprises plural switching elements coupled in series, each of the switching elements receiving a separate one of the shunt control signals for the means for shunting.

19. A switching device comprising:
at least five terminals, the terminals including at least two poles and at least three throws;
a plurality of series switches, a series switch count equalling a pole count M multiplied by a throw count N, each series switch receiving a control signal, each series switch being coupled between one of the poles and one of the throws, wherein each pole is operably coupled to each throw through one of the series switches;
a plurality of means for shunting, each means for shunting receiving plural shunt control signals;
wherein for each of a plurality of the terminals one of the means for shunting is coupled between plural adjacent series switches for the terminal, the one of the means for shunting being a coupled means for shunting for the terminal, the terminal with the coupled means for shunting being a shunted terminal;
wherein for each shunted terminal the shunt control signals for the coupled means for shunting include:
the control signal received by each distant series switch for the terminal; or
the control signal received by each adjacent series switch for the terminal; or
a signal complementary to the control signal received by each adjacent series switch for the terminal.

20. The switching device of claim 19,
wherein the shunt control signals are of a single type.

21. A switching device comprising:
at least four terminals, the terminals including at least two poles and at least two throws, each pole having a pole DC potential, each throw having a throw DC potential;
a plurality of series switches, a series switch count equalling a pole count M multiplied by a throw count N, each series switch receiving a control signal, each series switch being coupled between one of the poles and one of the throws, wherein each pole is operably coupled to each throw through one of the series switches;
a plurality of means for shunting, a shunt count equalling the pole count M plus the throw count N, each means for shunting receiving at least one shunt control signals;
wherein for each terminal one of the means for shunting is coupled between plural adjacent series switches for the terminal, the one of the means for shunting being a coupled means for shunting for the terminal;
wherein for each pole the shunt control signals for the coupled means for shunting include the pole DC potential for each distant pole;
wherein for each throw the shunt control signals for the coupled means for shunting include the throw DC potential for each distant throw
wherein at least one of the means for shunting comprises plural switching elements, each of the switching elements receiving a separate one of the shunt control signals for the means for shunting.

* * * * *